United States Patent
Fujimori

(10) Patent No.: US 11,888,500 B2
(45) Date of Patent: Jan. 30, 2024

(54) ENCODING CIRCUIT, DECODING CIRCUIT, AND DECODING METHOD

(71) Applicant: Mitsubishi Electric Corporation, Tokyo (JP)

(72) Inventor: Takafumi Fujimori, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/888,059

(22) Filed: Aug. 15, 2022

(65) Prior Publication Data
US 2022/0393701 A1 Dec. 8, 2022

Related U.S. Application Data

(63) Continuation of application No. PCT/JP2020/018192, filed on Apr. 28, 2020.

(51) Int. Cl.
*H03M 13/00* (2006.01)
*H03M 13/13* (2006.01)

(52) U.S. Cl.
CPC ......... *H03M 13/13* (2013.01); *H03M 13/615* (2013.01); *H03M 13/6575* (2013.01)

(58) Field of Classification Search
CPC .............. H03M 13/13; H03M 13/615; H03M 13/6575; H03M 13/3977
See application file for complete search history.

(56) References Cited

U.S. PATENT DOCUMENTS

| | | | | |
|---|---|---|---|---|
| 9,176,927 | B2 * | 11/2015 | Gross | H03M 13/157 |
| 10,312,946 | B2 * | 6/2019 | Wang | H03M 13/2906 |
| 10,361,728 | B2 * | 7/2019 | Shi | H03M 13/134 |
| 10,447,435 | B2 * | 10/2019 | Shi | H04L 1/0045 |

(Continued)

FOREIGN PATENT DOCUMENTS

| | | |
|---|---|---|
| DE | 10 2014 113 340 A1 | 3/2015 |
| JP | 2019-535163 A | 12/2019 |

OTHER PUBLICATIONS

German Office Action for German Application No. 112020006781.5, dated Jun. 26, 2023, with an English translation.

(Continued)

*Primary Examiner* — Esaw T Abraham
(74) *Attorney, Agent, or Firm* — BIRCH, STEWART, KOLASCH & BIRCH, LLP

(57) ABSTRACT

An encoding circuit includes: a polar encoding unit capable of encoding a polar code of N bits; a frozen bit adding unit that generates a first sequence by adding frozen bits to an input signal; and a bit arrangement changing unit that: generates a second sequence of N bits by arranging the first sequence in the second sequence according to an arrangement rule dependent on a ratio of $N_t$ bits, being a code length of a polar code to be encoded and being N bits or less, and N bits, and setting bit values at bit positions other than positions where the first sequence is arranged in the second sequence to zero when $N_t$ bits are less than N bits; and inputs the second sequence to the polar encoding unit. A code word of $N_t$ bits is generated by thinning processing based on a result of encoding the second sequence.

23 Claims, 14 Drawing Sheets

(56) References Cited

U.S. PATENT DOCUMENTS

| | | | |
|---|---|---|---|
| 10,554,223 B2* | 2/2020 | Ge | H04L 1/0065 |
| 10,666,392 B2* | 5/2020 | Ge | H03M 13/618 |
| 10,812,107 B2* | 10/2020 | Saber | H04L 1/0041 |
| 10,966,118 B2 | 3/2021 | Li et al. | |
| 11,476,873 B2* | 10/2022 | Hui | H03M 13/2906 |
| 2017/0230059 A1 | 8/2017 | Giard et al. | |
| 2020/0099471 A1 | 3/2020 | Ye et al. | |

OTHER PUBLICATIONS

Tal, "List Decoding of Polar Codes," IEEE Transactions on Information Theory, vol. 61, No. 5, 2015, pp. 2213-2226.

Arikan, Erdal, "Channel Polarization: A Method for Constructing Capacity-Achieving Codes for Symmetric Binary-Input Memoryless Channels," IEEE Translations on Information Theory, vol. 55, No. 7, Jul. 2009, pp. 3051-3073.

* cited by examiner

_US 11,888,500 B2_

ENCODING CIRCUIT, DECODING CIRCUIT, AND DECODING METHOD

CROSS-REFERENCE TO RELATED APPLICATION

This application is a continuation application of International Application PCT/JP2020/018192, filed on Apr. 28, 2020, and designating the U.S., the entire contents of which are incorporated herein by reference.

BACKGROUND OF THE INVENTION

1. Field of the Invention

The present disclosure relates to a polar code encoding circuit, a decoding circuit, and a decoding method.

2. Description of the Related Art

Communication is generally performed by applying error correction technology so as to cope with errors caused by noise or the like generated in the communication channel. Polar codes, a form of error correction code, can realize a characteristic asymptotically approaching the Shannon limit on the basis of the concept of channel polarization (see Non Patent Literature 1, "E. Arikan, "Channel Polarization: A Method for Constructing Capacity-Achieving Codes for Symmetric Binary-Input Memoryless Channels," IEEE Transactions on Information Theory, vol. 55, no. 7, pp. 3051-3073, July 2009." below). Polar codes are a type of block code. A polar code is encoded by repeating coupling through exclusive OR and wiring change for changing the combination to be coupled on the bits in the block. Because of the code configuration, the code lengths of polar codes are powers of two ($2^m$ (m is an integer of zero or more)).

Japanese Patent Application Laid-open No. 2019-535163 discloses a communication system that transmits and receives data of power-of-two bits using the principle that the code lengths of polar codes are powers of two. This communication system skips rate conversion processing by changing the code length of a polar code according to the number of bits of the data to be transmitted and received. With this configuration, rate conversion processing with high complexity such as puncturing and shortening can be skipped, so that it is possible to reduce the load and processing delay of transmission/reception processing, for example.

However, despite the description that rate conversion processing is skipped by switching the code length of a polar code, the conventional technique does not disclose how to implement an encoding circuit for polar codes of a plurality of code lengths. The encoding circuit for polar codes of a plurality of code lengths can be implemented by parallelizing encoding circuits for polar codes corresponding to the plurality of code lengths. However, if the number of combinations of bits expected in the communication system is large, the number of code lengths to be supported is also large, leading to a problematic increase in circuit scale.

SUMMARY OF THE INVENTION

In order to solve the above problem, an encoding circuit according to the present disclosure includes: a first polar encoding unit capable of encoding a polar code of a first code length; and a frozen bit adding unit to generate a first sequence by adding frozen bits to an input signal. The encoding circuit further includes a bit arrangement changing unit to: generate a second sequence of the first code length by arranging the first sequence in the second sequence according to an arrangement rule that depends on a ratio of a second code length and the first code length, the second code length being a code length of a polar code to be encoded and being less than or equal to the first code length, and setting bit values at bit positions other than positions where the first sequence is arranged in the second sequence to zero when the second code length is less than the first code length; and input the second sequence to the first polar encoding unit, and a code word of the second code length is generated by thinning processing that is based on a result of encoding the second sequence by the first polar encoding unit.

DETAILED DESCRIPTION OF THE PREFERRED EMBODIMENTS

Hereinafter, an encoding circuit, a decoding circuit, and a decoding method according to embodiments will be described in detail with reference to the drawings.

First Embodiment

Figure 1:
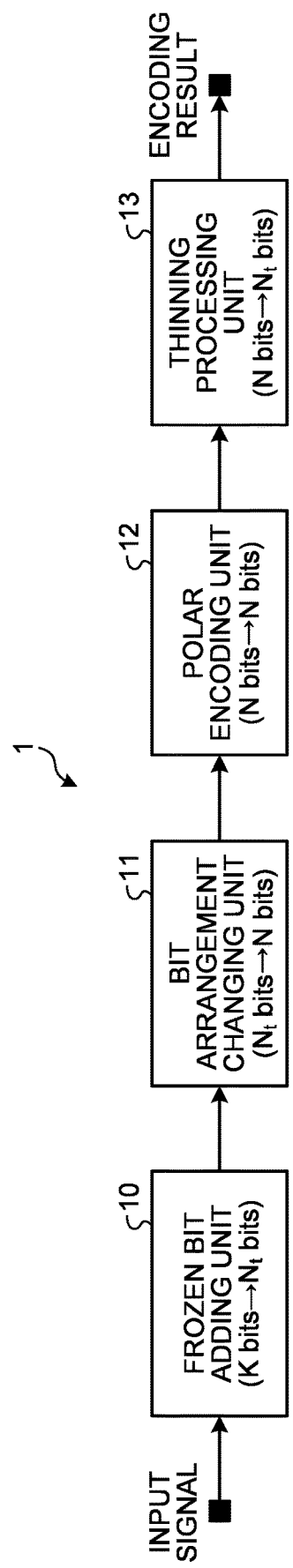
FIG. 1 is a block diagram illustrating an exemplary configuration of an encoding circuit according to a first embodiment.

FIG. 1 is a block diagram illustrating an exemplary configuration of an encoding circuit according to a first embodiment. An encoding circuit 1 illustrated in FIG. 1 generates non-systematic polar codes. Note that hereinafter, non-systematic polar codes are referred to as polar codes, and systematic polar codes in which the same information bit sequence appears before and after encoding are referred to as systematic polar codes.

The encoding circuit 1 illustrated in FIG. 1 includes a frozen bit adding unit 10, a bit arrangement changing unit 11, a polar encoding unit 12, and a thinning processing unit 13. Here, information bits are indicated by K bits, the largest code length (maximum code length) that can be supported by the encoding circuit 1 is indicated by N bits, and the code length of a polar code to be encoded by the encoding circuit 1 is indicated by $N_t$ bits. $N_t$ bits can be selected from among the values that are powers of two and not greater than the maximum code length N bits.

The frozen bit adding unit 10 adds, to an input signal, fixed values called frozen bits associated with polar encoding. Frozen bits are set by focusing on differences in communication capacity between bit positions in a coding block due to channel polarization which is a feature of polar codes, arranging information bits in a portion having a large communication capacity, and setting $N_t$-K bits that are not the information bits to a fixed value such as zero. The frozen bit adding unit 10 adds frozen bits such that a first sequence obtained as the result of the addition of frozen bits has $N_t$ bits. Frozen bits correspond to redundant bits such as parity bits in other error correction methods. Note that the setting position of frozen bits in the present invention is not limited to the above-described example, and commonly used setting methods can be used in addition to the method based on the above-described concept of channel polarization.

Hereinafter, the maximum code length is also referred to as a first code length, and the code length $N_t$ bits is also referred to as a second code length. The bit arrangement changing unit 11 generates a second sequence of the first code length by arranging the first sequence in the second sequence according to an arrangement rule that depends on the ratio of the second code length and the first code length, the second code length being the code length of a polar code to be encoded and being less than or equal to the first code length, and inputs the second sequence to the polar encoding unit 12. That is, the bit arrangement changing unit 11 performs bit arrangement processing to extend the first sequence of the code length $N_t$ bits obtained as the result of the addition of frozen bits by the frozen bit adding unit 10 to the second sequence of N bits, or the maximum code length, and rearrange the bits. The arrangement rule for the bit arrangement processing is, for example, a rule that the first sequence of $N_t$ bits is arranged in the second sequence bit by bit every $N/N_t$ bits, and the bit values of the second sequence at which bits of the first sequence are not arranged are set to zero. Specifically, for example, when $N_t$ is less than N, the bit arrangement changing unit 11 arranges the bit values of the first sequence at every n-th bit position in the second sequence, where n is a quotient obtained by dividing N by $N_t$. When the second code length is equal to the first code length, that is, in the case of $N=N_t$, the bit arrangement changing unit 11 inputs the first sequence as the second sequence to the polar encoding unit 12.

The polar encoding unit 12, which is a first polar encoding unit, performs polar encoding of N bits, or the maximum unit, on the second sequence to generate an N-bit code word. The thinning processing unit 13 selects and outputs the encoding result of the encoding circuit 1, that is, $N_t$ bits to be the final code word generated by the encoding circuit 1, from the code word generated by the polar encoding unit 12. Consequently, the code word of the second code length is generated by thinning processing that is based on the result of encoding the second sequence by the polar encoding unit 12.

FIGS. 2 to 5 are diagrams for explaining examples of processing in the bit arrangement changing unit 11, the polar encoding unit 12, and the thinning processing unit 13 according to the present embodiment. In the examples illustrated in FIGS. 2 to 5, N=16 is given, that is, the maximum code length is 16 bits.

Figure 2:
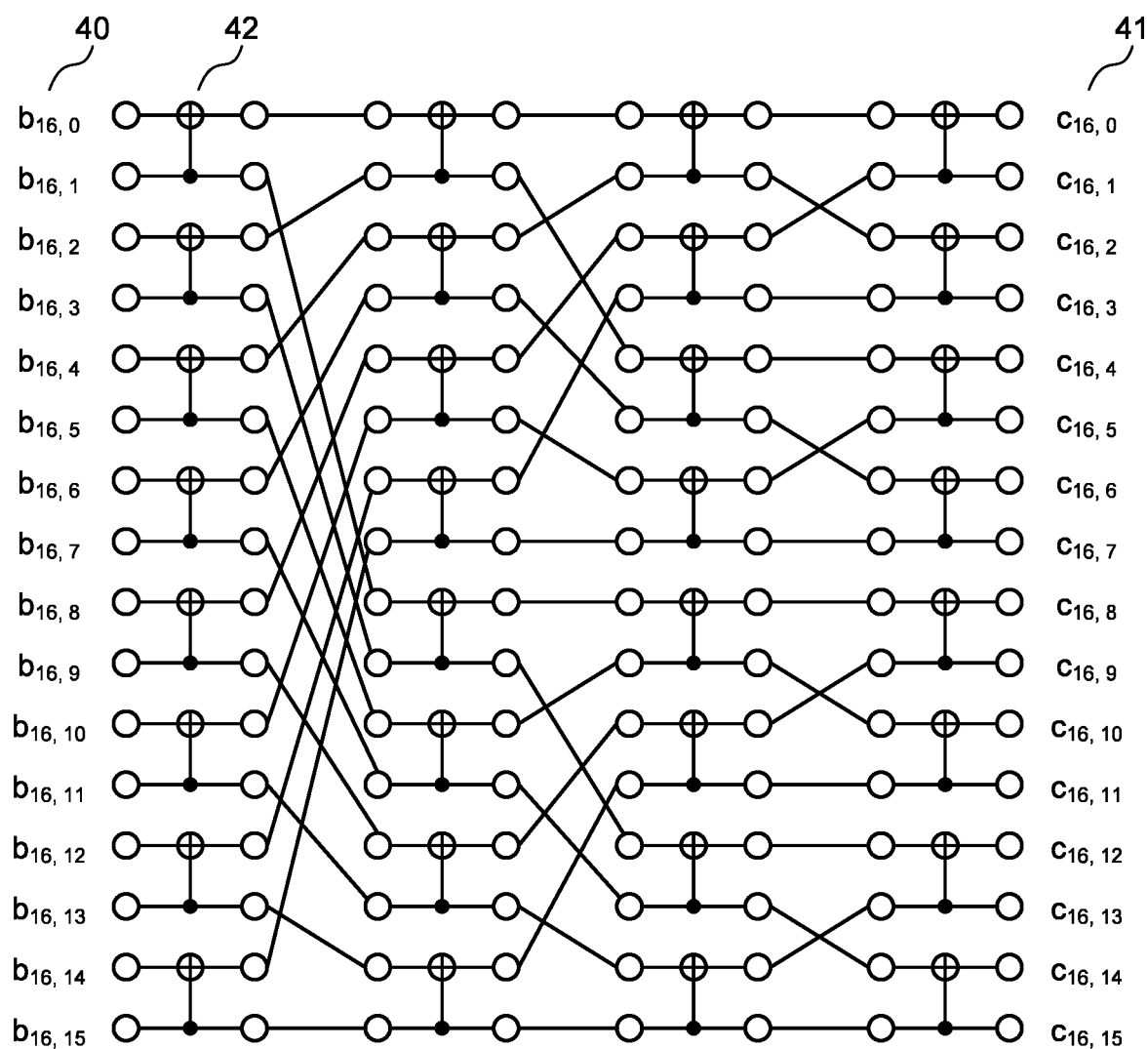
FIG. 2 is a diagram for explaining an example of processing in the bit arrangement changing unit, the polar encoding unit, and the thinning processing unit according to the first embodiment ($N=N_t=16$)

The example illustrated in FIG. 2 shows the case of $N=N_t=16$, and the bit arrangement changing unit 11 outputs the first sequence output from the frozen bit adding unit 10 as it is as the second sequence. The second sequence is an input bit sequence 40 input to the polar encoding unit 12. In FIG. 2, the input bit sequence 40 is $b16=[b_{16,0}, b_{16,1}, \ldots, b_{16,15}]$, and a code word 41 output from the polar encoding unit 12 is $c16=[c_{16,0}, c_{16,1}, \ldots, c_{16,15}]$.

Since the polar code is encoded by repeating coupling through exclusive OR and wiring change for changing the combination to be coupled, the polar encoding unit 12 includes a plurality of exclusive OR circuits 42 as illustrated in FIG. 2. In the encoding circuit for polar codes of a code length of $2^m$, $2^m-1$ exclusive OR circuits 42 are connected in m stages. In the example illustrated in FIG. 2, $2^m-1$, that is, eight exclusive OR circuits 42 arranged vertically are shown in four stages in the horizontal direction. The output of the exclusive OR circuits 42 in each stage is subjected to recombination, i.e. wiring change for changing the combination to be coupled, and connected to the input of the next stage.

As illustrated in FIG. 2, in the case of $N=N_t$, bit extension and rearrangement have not been performed by the bit arrangement changing unit 11; therefore, $c16=[c_{16,0}, c_{16,1}, \ldots, c_{16,15}]$ which is the code word 41 output from the polar encoding unit 12 can be output as it is as the encoding result of the encoding circuit 1. Therefore, the thinning processing unit 13 outputs the code word 41 output from the polar encoding unit 12 as it is as the encoding result.

Figure 3:
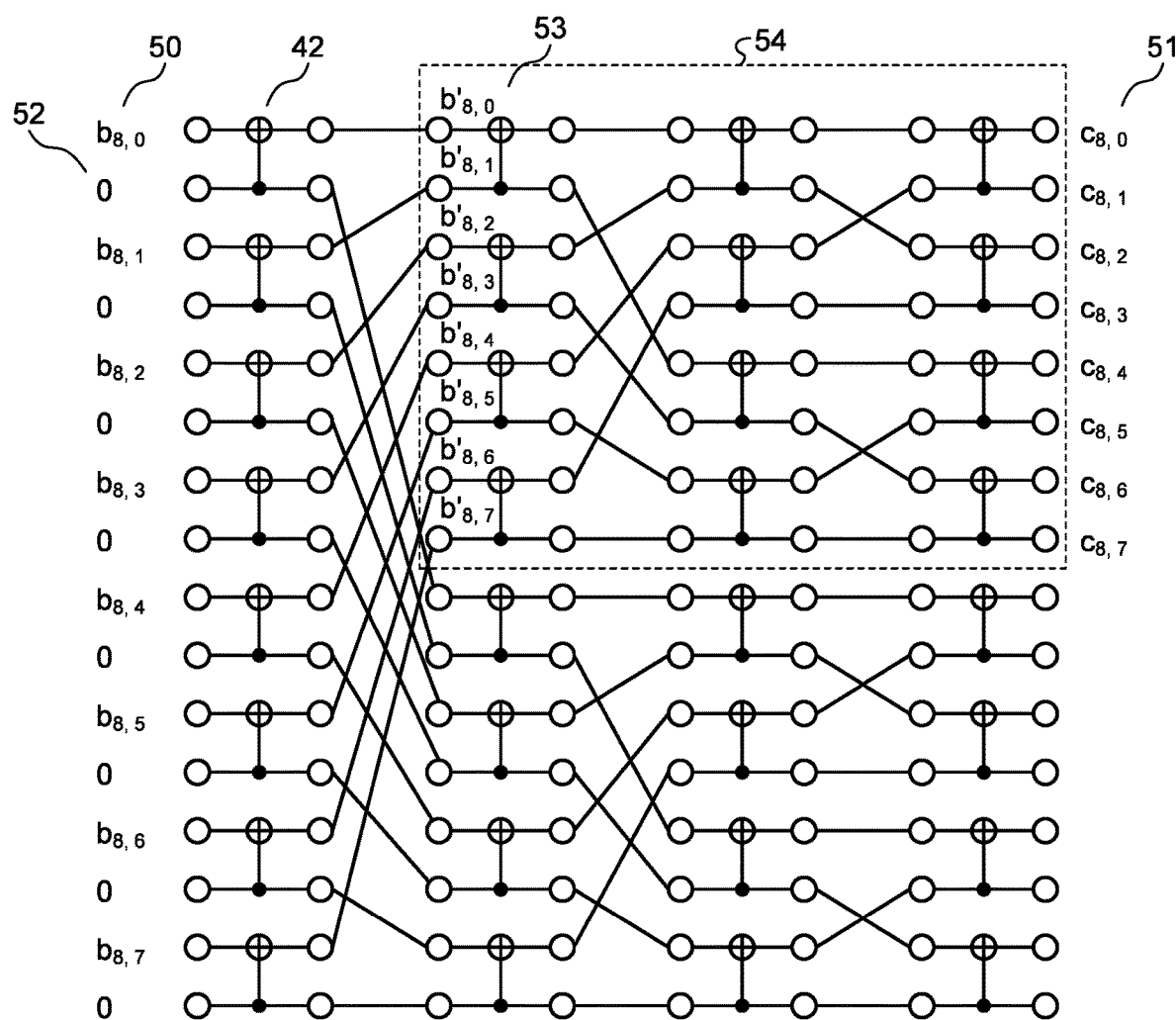
FIG. 3 is a diagram for explaining an example of processing in the bit arrangement changing unit, the polar encoding unit, and the thinning processing unit according to the first embodiment ($N=16$, $N_t=8$)

The example illustrated in FIG. 3 shows the case of $N_t=8$ and $N/N_t=2$. The first sequence output from the frozen bit adding unit 10 is eight bits long. Given the first sequence of $b8=[b_{8,0}, b_{8,1}, \ldots, b_{8,7}]$, the bit arrangement changing unit 11 arranges each of the b8 bits every two bits in the second sequence of N bits for extension to N bits, and adds zero values 52 to the other bits of the second sequence. This second sequence is input to the polar encoding unit 12 as an input bit sequence 50.

As illustrated in FIG. 3, given that the result of the exclusive OR by the first-stage exclusive OR circuits 42 of the polar encoding unit 12 is $b'8=[b'_{8,0}, b'_{8,1}, \ldots, b'_{8,7}]$ which is an eight-bit bit sequence 53, the b'8 bits are input to an encoding processing unit 54 after recombination. The encoding processing unit 54 is the exclusive OR circuits 42 in the second and subsequent stages to which the result of the exclusive OR in the first stage is input. The encoding processing unit 54 is equivalent to the encoding circuit for polar codes of eight bits, that is, $N_t$ bits. Since the result of the exclusive OR of a bit value x and zero is x, b'8 is equal to b8. Therefore, $c8=[c_{8,0}, c_{8,1}, \ldots, c_{8,7}]$ which is a code word 51 output from the encoding processing unit 54 is the result of encoding b8. Therefore, the thinning processing unit 13 performs thinning processing so as to select and output the bits corresponding to the code word 51 from the N-bit code word output from the polar encoding unit 12. Consequently, the thinning processing unit 13 can output the result of encoding the eight-bit polar code. As illustrated in FIG. 3, the code word 51 is bits of the second code length at consecutive bit positions.

Figure 4:
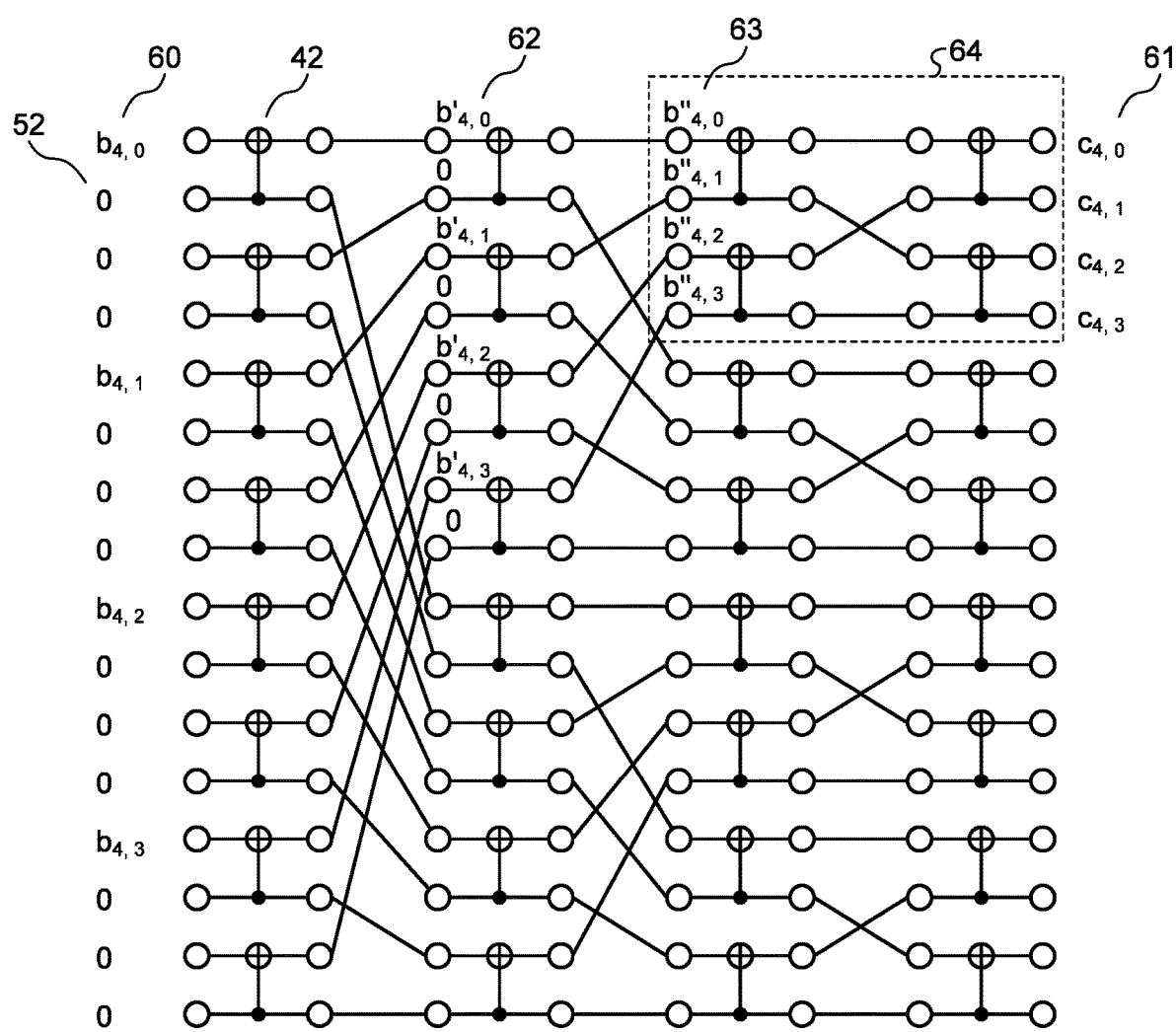
FIG. 4 is a diagram for explaining an example of processing in the bit arrangement changing unit, the polar encoding unit, and the thinning processing unit according to the first embodiment ($N=16$, $N_t=4$)

The example illustrated in FIG. 4 shows the case of $N_t=4$ and $N/N_t=4$. The first sequence output from the frozen bit adding unit 10 is four bits long. Given the first sequence of $b4=[b_{4,0}, b_{4,1}, \ldots, b_{4,3}]$, the bit arrangement changing unit 11 arranges each of the b4 bits every four bits in the second sequence of N bits for extension to N bits, and adds the zero values 52 to the other bits of the second sequence. This second sequence is input to the polar encoding unit 12 as an input bit sequence 60.

As illustrated in FIG. 4, the result of the exclusive OR by the first-stage exclusive OR circuits 42 of the polar encoding unit 12 is an eight-bit bit sequence 62 in which zero is inserted between the bits of the four-bit bit sequence $b'4=[b'_{4,0}, b'_{4,1}, \ldots, b'_{4,3}]$. Given that a bit string 63 that is the result of the exclusive OR by the second-stage exclusive OR circuits 42 on the bit sequence 62 is $b''4=[b''_{4,0}, b''_{4,1}, \ldots, b''_{4,3}]$, the b''4 bits are input to an encoding processing unit 64 after recombination. The encoding processing unit 64 is the exclusive OR circuits 42 in the third and subsequent stages to which the result of the exclusive OR of the bit sequence 62 is input. The encoding processing unit 64 is equivalent to the encoding circuit for polar codes of four bits, that is, $N_t$ bits. Since b''4 is equal to b4, $c4=[c_{4,0}, c_{4,1}, \ldots, c_{4,3}]$ which is a code word 61 output from the encoding processing unit 64 is the result of encoding b4. Therefore, the thinning processing unit 13 performs thinning processing so as to select and output the bits corresponding to the code word 61 from the N-bit code word output from the polar encoding unit 12. Consequently, the thinning processing unit 13 can output the result of encoding the four-bit polar code.

Figure 5:
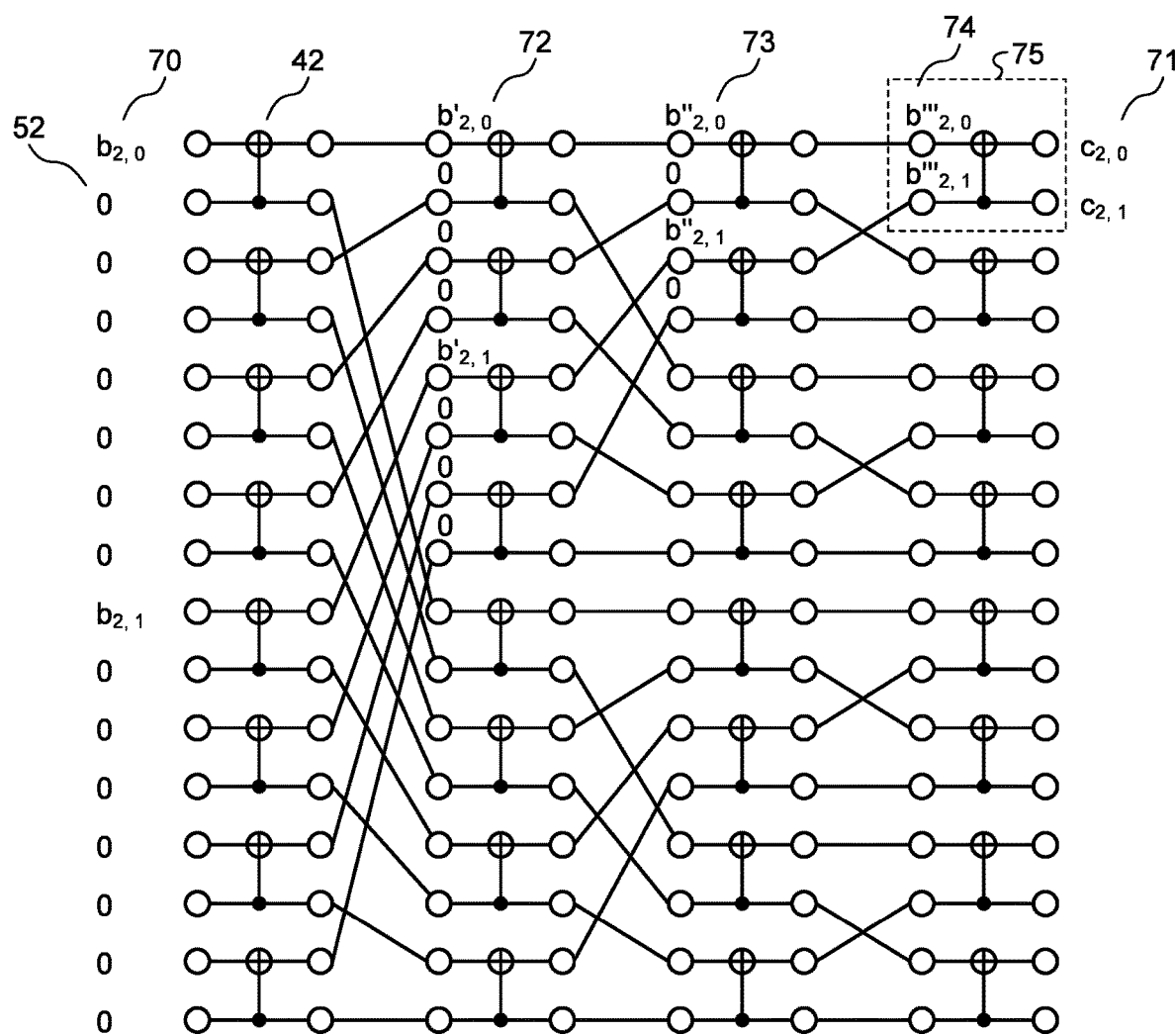
FIG. 5 is a diagram for explaining an example of processing in the bit arrangement changing unit, the polar encoding unit, and the thinning processing unit according to the first embodiment ($N=16$, $N_t=2$)

The example illustrated in FIG. 5 shows the case of $N_t=2$ and $N/N_t=8$. The first sequence output from the frozen bit adding unit 10 is two bits long. Given the first sequence of $b2=[b_{2,0}, b_{2,1}]$, the bit arrangement changing unit 11 arranges each of the b2 bits every eight bits in the second sequence of N bits for extension to N bits, and adds the zero values 52 to the other bits of the second sequence. This second sequence is input to the polar encoding unit 12 as an input bit sequence 70.

As illustrated in FIG. 5, the result of the exclusive OR by the first-stage exclusive OR circuits 42 of the polar encoding unit 12 is an eight-bit bit sequence 72 in which three zeros are inserted between the bits of the two-bit bit sequence $b'2=[b'_{2,0}, b'_{2,1}]$. A bit sequence 73 which is the result of the exclusive OR by the second-stage exclusive OR circuits 42 on the bit sequence 72 is a four-bit bit sequence in which zero is inserted between the bits of the two-bit bit sequence $b''2=[b''_{2,0}, b''_{2,1}]$. A bit sequence 74 which is the result of the exclusive OR by the third-stage exclusive OR circuits 42 on the bit sequence 73 is input to an encoding processing unit 75 after recombination as $b'''2=[b'''_{2,0}, b'''_{2,1}]$. The encoding processing unit 75 is the fourth-stage exclusive OR circuits 42 to which the result of the exclusive OR of the bit sequence 73 is input. The encoding processing unit 75 is equivalent to the encoding circuit for polar codes of two bits, that is, $N_t$ bits. Since b'''2 is equal to b2, $c2=[c_{2,0}, c_{2,1}]$ which is a code word 71 output from the encoding processing unit 75 is the result of encoding b2. Therefore, the thinning processing unit 13 performs thinning processing so as to select and output the bits corresponding to the code word 71 from the N-bit code word output from the polar encoding unit 12. Consequently, the thinning processing unit 13 can output the result of encoding the two-bit polar code.

As described above, in the encoding circuit 1, the bit arrangement changing unit 11 extends and rearranges the first sequence output from the frozen bit adding unit 10 every $N/N_t$ to generate an N-bit second sequence, and the thinning processing unit 13 thins the N-bit polar encoding result, whereby it is possible to perform polar encoding of a plurality of code lengths not greater than N bits. That is, in the present embodiment, given $N=2^m$ (m is an integer of one or more), polar encoding of code lengths of power-of-two bits from 2 to $2^m$ bits can be executed by sharing a single circuit.

Note that although the examples of N=16 are shown in FIGS. 2 to 5, N can be larger than 16 or less than 16, in which case polar encoding of a plurality of code lengths can also be performed using a single circuit by performing extension to N bits and thinning as in the case of N=16. The configuration of the polar encoding unit 12 illustrated in FIGS. 2 to 5 is an example, and the input position of the bit sequence input to the polar encoding unit 12, the connection for wiring change from each exclusive OR circuit 42 in the polar encoding unit 12, and the like are not limited to the examples illustrated in FIGS. 2 to 5. The bit positions at which bits such as c8, c4, and c2 described above are output can differ from those in the examples illustrated in FIGS. 2 to 5 due to different input positions, wiring connections, and the like, in which case results similar to those in the examples illustrated in FIGS. 2 to 5 can be obtained by the thinning processing unit 13 selecting and outputting the bits at the bit positions corresponding to c8, c4, and c2.

For example, suppose that each element of the b8 bit sequence is shifted downward by one bit in the exemplary configuration illustrated in FIG. 3 to replace the zero values 52 with the b8 elements. In this case, after the exclusive OR computation and the recombination, the b'8 bit sequence is input to a portion below the encoding processing unit 54 in FIG. 3 equivalent to the encoding processing unit 54. Therefore, the thinning processing unit 13 is only required to select and output the bits output from the portion equivalent to the encoding processing unit 54 from the bit sequence output from the polar encoding unit 12.

The encoding circuit 1 according to the present embodiment can perform polar encoding adapted to the code length $N_t$ in response to an instruction of $N_t$ being input from the outside or to the value of $N_t$ held therein being changed. Thus, the encoding circuit 1 according to the present embodiment can dynamically change the code length, and therefore the code length can be switched by sharing a single circuit, and an increase in circuit scale can be prevented.

Figure 6:
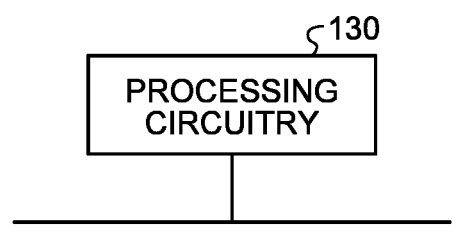
FIG. 6 is a diagram illustrating processing circuitry that is dedicated hardware according to the first embodiment.

Next, hardware for implementing the encoding circuit 1 according to the present embodiment will be described. Each unit constituting the encoding circuit 1 can be implemented by processing circuitry that is dedicated hardware. FIG. 6 is a diagram illustrating processing circuitry that is dedicated hardware according to the present embodiment. Each unit constituting the encoding circuit 1 is implemented by, for example, processing circuitry 130 illustrated in FIG. 6.

For example, the processing circuitry 130 is a single circuit, a composite circuit, a programmed processor, a parallel programmed processor, an application specific integrated circuit (ASIC), a field-programmable gate array (FPGA), or a combination thereof. The functions of the respective units constituting the encoding circuit 1 may be implemented by different pieces of processing circuitry 130, or all or some of the functions of the respective units may be collectively implemented by one or more pieces of processing circuitry.

Figure 7:
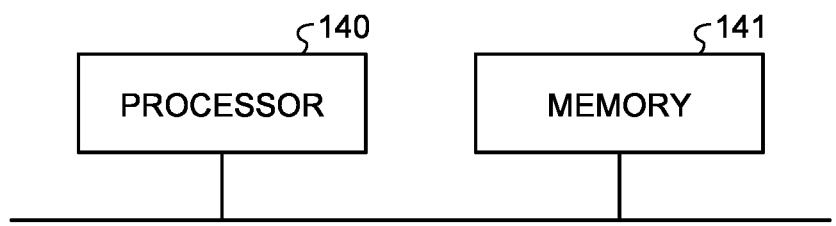
FIG. 7 is a diagram illustrating an example of a control circuit according to the first embodiment.

The processing circuitry that implements each unit constituting the encoding circuit 1 may be a control circuit including a processor. FIG. 7 is a diagram illustrating an example of a control circuit according to the present embodiment. As illustrated in FIG. 7, the control circuit includes a processor 140 and a memory 141. In a case where the functions of the respective units constituting the encoding circuit 1 are implemented with the control circuit illustrated in FIG. 7, these functions can be implemented by software, firmware, or a combination of software and firmware. Software and firmware are described as programs and stored in the memory 141. The processor 140 reads and executes programs from the memory 141, thereby implementing the functions of the respective units of the encoding circuit 1. It can also be said that these programs cause a computer to execute the procedures and methods that are executed by the encoding circuit 1. The programs may be provided by a storage medium or a communication medium.

Here, examples of the memory 141 include a non-volatile or volatile semiconductor memory, a magnetic disk, a flexible disk, an optical disc, a compact disc, a mini disc, a digital versatile disk (DVD), and the like. Examples of the non-volatile or volatile semiconductor memory include a random access memory (RAM), a read only memory (ROM), a flash memory, an erasable programmable read only memory (EPROM), an electrically erasable programmable read only memory (EEPROM, registered trademark), and the like.

Note that some of the functions of the respective units of the encoding circuit 1 may be implemented by dedicated hardware, and the other functions may be implemented by software or firmware. The function of the polar encoding unit 12 can be implemented by dedicated hardware, and the functions of the frozen bit adding unit 10, the bit arrangement changing unit 11, and the thinning processing unit 13 can be implemented by a processor and a memory. As described above, the functions of the respective units of the encoding circuit 1 may be implemented by a combination of processing circuitry which is dedicated hardware and a control circuit.

Second Embodiment

Figure 8:
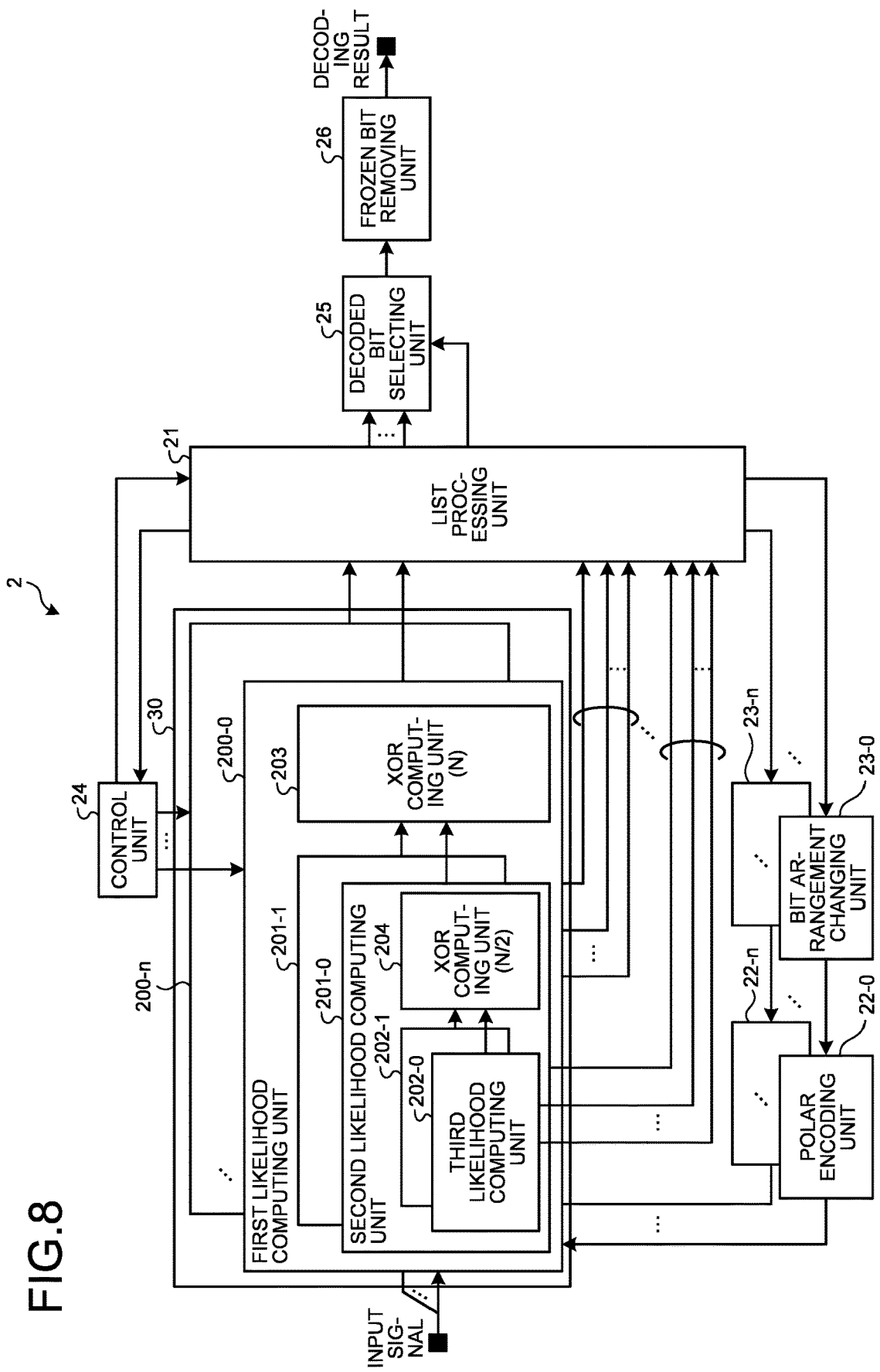
FIG. 8 is a block diagram illustrating an exemplary configuration of a decoding circuit according to a second embodiment.

FIG. 8 is a block diagram illustrating an exemplary configuration of a decoding circuit according to a second embodiment. A decoding circuit 2 illustrated in FIG. 8 executes processing of successive cancellation list decoding (SCLD), a representative method of polar code decoding. Successive cancellation list decoding is an example of sequential decoding.

The decoding circuit 2 according to the present embodiment can decode a polar code of a code length less than or equal to N bits. Specifically, given $N=2^m$, decoding of polar codes of code lengths of power-of-two bits from 2 to $2^m$ bits can be performed by switching the code length. The decoding circuit 2 according to the present embodiment can perform decoding adapted to the code length $N_t$ in response to an instruction of $N_t$ being input from the outside or to the value of $N_t$ held therein being changed. The decoding circuit 2 may decode a polar code encoded by the encoding circuit 1 according to the first embodiment, or may decode a polar code generated by an encoding circuit different from the encoding circuit 1 according to the first embodiment.

As illustrated in FIG. 8, the decoding circuit 2 according to the present embodiment includes a list processing unit 21, a likelihood calculating unit 30, polar encoding units 22-0 to 22-n, bit arrangement changing units 23-0 to 23-n, a control unit 24, a decoded bit selecting unit 25, and a frozen bit removing unit 26. The value n+1 of zero to n indicates the number of first likelihood computing units. For example, n+1 may be less than L, where L represents the number of lists indicating the maximum number of decoding candidates expected in successive cancellation list decoding. In a case where n+1 is L, L first likelihood computing units, L polar encoding units, and L bit arrangement changing units are provided in parallel corresponding to the number of lists L. When no distinction is made between the polar encoding units 22-0 to 22-n, the polar encoding units 22-0 to 22-n can be collectively referred to as the polar encoding unit 22, and when no distinction is made between the bit arrangement changing units 23-0 to 23-n, the bit arrangement changing units 23-0 to 23-n can be collectively referred to as the bit arrangement changing unit 23.

The likelihood calculating unit 30 can calculate likelihood information of a polar code of N bits, and calculates likelihood information corresponding to a polar code of $N_t$ bits on the basis of an input signal and a decoding interim result. The likelihood calculating unit 30 includes first likelihood computing units 200-0 to 200-n. The first likelihood computing units 200-0 to 200-n compute likelihood information corresponding to $N=N_t$ using the input signal to be decoded and the decoding interim information output from the polar encoding units 22-0 to 22-n. The likelihood information is information for determining decoding candidates in the list processing unit 21. Hereinafter, an example in which the input signal is log likelihood ratio (LLR) will be described, but similar processing can be performed even when the input signal is not LLR. The input signal may be soft decision information such as likelihood or probability.

The first likelihood computing units 200-0 to 200-n have the same configuration. Hereinafter, when no distinction is made between the first likelihood computing units 200-0 to 200-n, the first likelihood computing units 200-0 to 200-n can be collectively referred to as the first likelihood computing unit 200.

The first likelihood computing unit 200 includes second likelihood computing units 201-0 and 201-1 and an XOR computing unit (exclusive OR operation unit) 203. The second likelihood computing units 201-0 and 201-1 have the same configuration. Each of the second likelihood computing units 201-0 and 201-1 computes likelihood information corresponding to $N_t=N/2$ using the input signal and the decoding interim information output from the polar encoding units 22-0 to 22-n. The XOR computing unit 203 performs exclusive OR operation of LLR using the likelihood information output from the second likelihood computing unit 201-0, the likelihood information output from the second likelihood computing unit 201-1, and the decoding interim information output from the polar encoding unit 22, and outputs the computation result to the list processing unit 21. Hereinafter, when no distinction is made between the second likelihood computing units 201-0 and 201-1, the second likelihood computing units 201-0 and 201-1 can be collectively referred to as the second likelihood computing unit 201.

The second likelihood computing unit 201 includes third likelihood computing units 202-0 and 202-1 and an XOR computing unit (exclusive OR operation unit) 204. The third likelihood computing units 202-0 and 202-1 have the same configuration. Each of the third likelihood computing units 202-0 and 202-1 computes likelihood information corresponding to $N_t=N/4$ using the input signal and the decoding interim information output from the polar encoding units 22-0 to 22-n. The XOR computing unit 204 performs exclusive OR operation of LLR using the likelihood information output from the third likelihood computing unit 202-0, the likelihood information output from the third likelihood computing unit 202-1, and the decoding interim information output from the polar encoding unit 22, and outputs the computation result to the XOR computing unit 203 as the likelihood information computed by the second likelihood computing unit 201. Hereinafter, when no distinction is made between the third likelihood computing units 202-0 and 202-1, the third likelihood computing units 202-0 and 202-1 can be collectively referred to as the third likelihood computing unit 202.

In a case where N is 16, that is, in a case where m is four, the third likelihood computing unit 202 includes two fourth likelihood computing units that compute likelihood information corresponding to $N_t=N/8$ and an XOR computing unit (exclusive OR operation unit), which are not illustrated in FIG. 8. Similarly, in a case where m is five or more, an i-th likelihood computing unit that computes likelihood information corresponding to $N_t=2$ is taken as the minimum unit, and the nested configuration in which each likelihood computing unit includes two likelihood computing units and one XOR computing unit is repeated until the i-th likelihood computing unit of the minimum unit is obtained. In the case of N=16, i is four, and thus the third likelihood computing units 202-0 and 202-1 include two fourth likelihood computing units and an XOR computing unit. Note that in the case of N=4, the second likelihood computing units 201-0 and 201-1 compute likelihood information corresponding to $N_t=4/2=2$; therefore, the second likelihood computing units 201-0 and 201-1 do not include the third likelihood computing units 202-0 and 202-1 and the XOR computing unit 204. The following description refers to an example in which N=16 is given. In the case of N=16, as described above, the fourth likelihood computing units are the minimum-unit likelihood computing units. Note that the number of nested stages, which is the value of i, varies depending on the value of N, and i=m holds. Therefore, in the case of N=32, the fifth likelihood computing units are the minimum-unit likelihood computing units, and the fourth likelihood computing units are the likelihood computing units corresponding to $N_t=4$. In this manner, the value of $N_t$ corresponding to the likelihood computing units in each stage varies depending on the value of N. The likelihood computing units such as the first to fifth likelihood computing units can be collectively referred to as the likelihood computing unit when no distinction is made therebetween.

As described above, given that $\log_2 N$ is m, the likelihood calculating unit 30 includes, hierarchically from i=1 to i=m−1, i-th likelihood computing units each including (i+1)-th likelihood computing units that calculate an exclusive OR of two pieces of likelihood information and an i-th XOR computing unit that calculates an exclusive OR of the two exclusive ORs calculated by the two (i+1)-th likelihood computing units.

The fourth likelihood computing unit, which is a minimum-unit likelihood computing unit that computes likelihood information corresponding to $N_t=2$, is a circuit that computes an exclusive OR of two input LLRs. The fourth likelihood computing unit inputs the exclusive OR of two input LLRs to the XOR computing unit (not illustrated) of the third likelihood computing unit 202 and the list processing unit 21. A minimum-unit likelihood computing unit is, for example, a circuit that computes likelihood information corresponding to a polar code encoded by the encoding processing unit 75 illustrated in FIG. 5 according to the first embodiment.

The XOR computing unit (not illustrated) of the third likelihood computing unit 202 corresponding to $N_t=4$ computes an exclusive OR by changing the combination of the pieces of likelihood information input from the two fourth likelihood computing units, and inputs the computation result to the XOR computing unit 203 and the list processing unit 21. The third likelihood computing unit 202 is, for example, a circuit that computes likelihood information corresponding to a polar code encoded by the encoding processing unit 64 illustrated in FIG. 4 according to the first embodiment.

The XOR computing unit 204 of the second likelihood computing unit 201 corresponding to $N_t=8$ computes an exclusive OR by changing the combination of the pieces of likelihood information input from the two third likelihood computing units 202, and inputs the computation result to the XOR computing unit 203 and the list processing unit 21. The second likelihood computing unit 201 is, for example, a circuit that computes likelihood information corresponding to a polar code encoded by the encoding processing unit 54 illustrated in FIG. 3 according to the first embodiment.

The XOR computing unit 203 of the first likelihood computing unit 200 corresponding to $N_t=16$ computes an exclusive OR by changing the combination of the pieces of likelihood information input from the two second likelihood computing units 201, and inputs the computation result to the list processing unit 21. The first likelihood computing unit 200 is a circuit that calculates likelihood information of a polar code of a code length of 16 bits.

In the case of N=16, eight (=N/2) minimum-unit likelihood computing units that compute likelihood information corresponding to $N_t=2$ can be implemented for one first likelihood computing unit 200 corresponding to one list. Therefore, LLRs of up to N bits can be input as input signals to the decoding circuit 2. In addition, in the case of N=16, four (=N/4) third likelihood computing units 202 corresponding to $N_t=4$ can be implemented for one first likelihood computing unit 200. In addition, in the case of N=16, two (=N/8) second likelihood computing units 201 corresponding to $N_t=8$ can be implemented for one first likelihood computing unit 200.

Decoding in the decoding circuit 2 is started when an input signal to be decoded is input to the minimum-unit likelihood computing units. Then, wiring lines are connected such that likelihood information that is a computation result from each of the L first likelihood computing units 200 that can be implemented in parallel corresponding to the number of lists L is input to the list processing unit 21, whereby the likelihood computing unit capable of executing likelihood computation processing of up to the code length $N_t$ can be configured. Given the maximum code length N=16, wiring lines for one list, that is, one first likelihood computing unit 200, are connected such that computation results of likelihood information are input to the list processing unit 21 from the first to fourth likelihood computing units corresponding respectively to the $N_t$ values of 16, 8, 4, and 2, and likelihood information is input from at least one of these wiring lines. Thus, the number of wiring lines per list from the first likelihood computing unit 200 to the list processing unit 21 is the number of nested stages $\log_2 N$ of the first likelihood computing unit 200. Therefore, given that the L first likelihood computing units 200 are arranged in parallel corresponding to the number of lists L, a total of $L \times \log_2 N$ wiring lines are connected.

Successive cancellation decoding is a method of bit-by-bit determination that involves repeating likelihood computation with input LLRs and a decoding interim result, processing of determining a one-bit decoding candidate using the likelihood computation result, and re-encoding of the determined decoding candidate. Successive cancellation list decoding involves assuming two types of decoding candidates in which the bit to be determined is zero or one with respect to the decoding candidates for a remaining list based on the likelihood computation result, and computing information such as path metric representing the likelihood of the assumed decoding candidates. Therefore, as the sequential decoding proceeds, the number of lists is doubled. When the number of lists is less than or equal to the maximum number of lists, all the lists (decoding candidates) are held, whereas when the number of lists is greater than or equal to the maximum number of lists, a process of deleting lists (decoding candidates) from the set of decoding candidates to the maximum number of lists on the basis of information indicating likelihood such as path metric is added. The n+1 units from zero to n arranged in parallel in the circuit configuration illustrated in FIG. 8 represent a form in which processes of different lists are processed in parallel. The list processing unit 21 is a processing unit that performs determination of decoding candidates, calculation of information indicating the likelihood of lists such as path metric, and management of decoding candidates (number of lists), excluding likelihood computation based on successive cancellation list decoding (processing of the likelihood calculating unit 30) and re-encoding of decoding candidates (processing of the polar encoding unit 22). The list processing unit 21 according to the present embodiment is a decoding processing unit that executes successive cancellation list decoding processing, which includes the above processes and an additional process of selecting the computation result of a likelihood computing unit associated with a specified or set value of $N_t$.

Note that the control unit 24 may notify the likelihood computing unit that needs to compute likelihood information according to the value of $N_t$ of the writing position of the computation result, and the list processing unit 21 may read data from the writing position so that the computation result for each list is input. Alternatively, all the likelihood computing units may output the computation results to the list processing unit 21, and the list processing unit 21 may select and use the necessary computation result on the basis of the information from the control unit 24.

After completion of processing for one bit, the list processing unit 21 outputs, to the bit arrangement changing units 23-0 to 23-$n$, decoding candidates in the middle of decoding processing for the number of lists L, and outputs, to the control unit 24, a flag indicating that the processing of the list processing unit 21 is completed, a decoding processing number, the number of lists in the middle of decoding, and the like. In addition, after sequential decoding for $N_t$ bits is completed, the list processing unit 21 outputs, to the decoded bit selecting unit 25, L decoding candidates and likelihood information such as path metric indicating the likelihood of the decoding candidates.

Similarly to the bit arrangement changing unit 11 of the encoding circuit 1 according to the first embodiment, the bit arrangement changing units 23-0 to 23-$n$, which are a first bit arrangement changing unit, generate a first bit sequence extended to N bits by arranging the decoding candidate elements every $N/N_t$ on the basis of the decoding candidates from the list processing unit 21, and output the first bit sequence to the corresponding polar encoding units 22-0 to 22-$n$. Here, the bit arrangement changing units 23-0 to 23-$n$ generate a bit sequence extended to N bits by setting the undecoded bits to zero values.

The polar encoding units 22-0 to 22-$n$, which are the first polar encoding unit, perform polar encoding of N bits on the first bit sequence input from the corresponding bit arrangement changing units 23-0 to 23-$n$ in a similar manner to the polar encoding unit 12 of the encoding circuit 1 according to the first embodiment, and input the polar encoding result to the corresponding first likelihood computing unit 200 as a decoding interim result.

The control unit 24 controls the processing of each likelihood computing unit and the processing of the list processing unit 21. On the basis of $N_t$ specified or set, the control unit 24 performs control such as control of various types of processing according to the number of lists, control of patterns to be computed by the likelihood computing unit, control of selection of computation results to be output, and control of stopping circuits such as unnecessary likelihood computing units in a case where $N_t = N$ is not satisfied. For example, the control unit 24 may control the bit position to be referred to by the likelihood calculating unit 30 in the encoding result from the polar encoding units 22-0 to 22-$n$.

As a specific example of the control of the control unit 24, decoding processing of the maximum code length N=16 and decoding processing of the code length $N_t = 8$ will be described in comparison, as in the example illustrated in FIG. 3. Computation for decoding processing proceeds from right to left in FIG. 3, and the exclusive OR circuits 42 correspond to the respective XOR computing units. In addition, the likelihood computation corresponding to each exclusive OR circuit 42 has two inputs and one output. In the decoding processing of the first bit of N=16 and $N_t = 8$, first, the XOR computing unit of the fourth likelihood computing unit corresponding to the first-stage exclusive OR circuit 42 from the right performs LLR likelihood computation using the LLRs input to the decoding circuit 2 on the $c_8$ side, and outputs the computation result as the output of the fourth likelihood computing unit. Note that, considering that each likelihood computation has two inputs and one output, the XOR computing units corresponding to the second, fourth, sixth, and eighth exclusive OR circuits 42 from the top of the second exclusive OR circuits 42 from the right may not be implemented on the decoding circuit. The second exclusive OR circuit 42 from the right performs LLR likelihood computation with the XOR computing unit of the third likelihood computing unit 202 using the output from the fourth likelihood computing unit, and outputs the computation result as the output of the third likelihood computing unit 202. Similarly, the XOR computing unit 204 of the second likelihood computing unit 201 corresponding to the third exclusive OR circuit 42 from the right performs likelihood computation using the output from the third likelihood computing unit 202, and outputs the computation result as the output of the second likelihood computing unit 201.

In the decoding processing of the first bit of $N_t=8$, the computation result of the second likelihood computing unit 201 is output to the list processing unit 21. In the decoding processing of the first bit of N=16, further, the XOR computing unit 203 of the first likelihood computing unit 200 corresponding to the fourth exclusive OR circuit 42 from the right performs likelihood computation using the output from the second likelihood computing unit 201, and outputs the computation result to the list processing unit 21 as the output of the first likelihood computing unit 200. In the likelihood computation processing of the first bit, the likelihood computation result of the likelihood computation with two inputs and one output is output to the list processing unit 21 at the position of b8,0 in the case of N=16 and the position of b'8,0 in the case of $N_t=8$. In both cases of N=16 and $N_t=8$, list decoding processing is performed by the list processing unit 21 using the output from the likelihood calculating unit 30, and re-encoding of decoding candidates is performed by the polar encoding unit 22. The re-encoding result from the polar encoding unit 22 is input to the likelihood calculating unit 30 for decoding processing of the second bit.

In the likelihood computation processing of the second bit of N=16, an operation similar to the operation of the likelihood computation processing of the first bit is performed up to the second likelihood computing unit 201. The XOR computing unit 203 of the first likelihood computing unit 200 performs the likelihood computation corresponding to the position of the second zero value from the leftmost top using the output of the second likelihood computing unit 201 and the re-encoding result output from the polar encoding unit 22, and outputs the likelihood computation result to the list processing unit 21. Thereafter, list decoding processing by the list processing unit 21 and re-encoding processing by the polar encoding unit 22 are executed, and the re-encoding processing result is input to the likelihood calculating unit 30. Upon re-encoding following the determination of the first and second bits of N=16, b'8,0 corresponding to the first bit of $N_t=8$ is determined. In this manner, in the likelihood computation processing, the likelihood computation processing corresponding to the first bit of $N_t=8$ is performed twice. However, in the case of $N_t=8$, even bits (second, fourth, sixth, eight, etc. from the top) of N=16 are fixed to zero values; therefore, the first bit of $N_t=8$ is considered to be determined upon the determination of the first bit of N=16. Therefore, in the case of $N_t=8$, the decoding processing of even bits of N=16 can be skipped. Similarly, in the middle of the likelihood computation processing of the third bit of N=16, the computation result is output from the XOR computing unit 204 of the second likelihood computing unit 201 to the list processing unit 21 for list decoding processing, and re-encoding is applied with the fourth bit of N=16 set to zero, which is equivalent to the determination of the bit candidate at the position of b'8,1. After that, similarly, the operation of performing the likelihood computation corresponding to an odd bit in the case of N=16 up to the computation of the XOR computing unit of the second likelihood computing unit 201, outputting the computation result to the list processing unit 21, performing by the list processing unit 21 list decoding processing using the computation result from the XOR computing unit 204 of the second likelihood computing unit 201 corresponding to $N_t=8$, and performing re-encoding processing by the polar encoding unit 22 is repeated, whereby the decoding processing of $N_t=8$ is performed with the decoding circuit for the maximum code length N=16. As another example in which $N_t=4$ is given, the processing of the likelihood computing unit is executed using the input LLRs to the decoding circuit 2 and the re-encoding result of decoding candidates. At this time, the likelihood computing unit repeats output of the computation result of the XOR computing unit of the third likelihood computing unit 202 to the list processing unit 21, list decoding processing by the list processing unit 21, and re-encoding by the polar encoding unit 22, whereby the decoding processing of $N_t=4$ is performed. In the case of $N_t=4$, the likelihood computation of the first, fifth, ninth, and thirteenth bits of N=16 is performed.

To summarize the above, each likelihood computing unit executes the likelihood computation processing of an odd bit among the likelihood computation processing of N=16, and outputs the computation result corresponding to the position of the bit sequence 53 of b'8 to the list processing unit 21. The list processing unit 21 determines decoding candidates bit by bit on the basis of the likelihood information corresponding to the number of lists. The bit arrangement changing units 23-0 to 23-n arrange the determined bits every two bits. This rearrangement processing of the bit arrangement changing units 23-0 to 23-n is in this example equivalent to performing the likelihood computation and the list decoding processing of the odd bits of N=16, skipping the processing of even bits, and arranging the bits by adding known zero bits as the result of the processing of even bits. By performing polar encoding processing in the polar encoding units 22-0 to 22-n, the encoding result of N=16, that is, the encoding result of $N_t=8$, is output, and the computation with the likelihood computing unit proceeds on the basis of this result. As described above, the control unit 24 performs control so as to execute the likelihood computation corresponding to odd bits among the first likelihood computation processing corresponding to $N=N_t$, whereby the likelihood computation processing for $N_t=8$ is performed. Note that a generalized description is that when $N_t$ is less than N, likelihood computation processing is executed every $N/N_t$, and the control unit 24 controls, according to $N_t$ input from the outside or the set value of $N_t$ held therein, the above-mentioned stop of unnecessary circuits in the likelihood calculating unit 30 and the computation processing of the likelihood calculating unit 30 required in the case of the code length $N_t$ among the decoding processing of the maximum code length N. Since the control unit 24 performs control so as to skip processing except on every $N/N_t$-th bit among the decoding operation of the maximum code length N, the decoding of the polar code can be completed in $N_t$ times of sequential decoding processing fewer than the number of times of sequential decoding on N with the circuit configuration for the maximum code length N.

In addition, in the case of N=16 and $N_t=8$, one of the two second likelihood computing units 201 corresponding to $N_t=8$ does not need to be used for decoding processing, and thus the control unit 24 may stop the function of this second likelihood computing unit 201. In addition, in a case where the number of lists is less than the maximum number of lists in the middle of decoding, the control unit 24 may perform control such as stopping a circuit that does not need to perform computation in the likelihood computing unit. The control unit 24 controls the processing in the list processing unit 21 using information such as how many bits have been decoded on the basis of the information from the list processing unit 21.

In addition, whether the bit to be decoded is a frozen bit or not is information necessary for decoding processing, because a plurality of processes occur such as increasing the number of decoding candidates when the bit to be decoded is an information bit and not increasing the number of decoding candidates when the bit to be decoded is a frozen bit, which is a known value. Therefore, the list processing unit 21 may hold frozen bit position information, and the control unit 24 may notify the list processing unit 21 of the bit number being processed by the list processing unit 21, so that the list processing unit 21 can determine whether the bit to be processed is a frozen bit. Alternatively, the control unit 24 may hold frozen bit position information, in which case the control unit 24 may notify the list processing unit 21 of information indicating whether the bit to be processed is a frozen bit. In this manner, the control unit 24 may notify the list processing unit 21 whether a target for processing in the list processing unit 21 is a frozen bit according to information representing the progress status of processing in the list processing unit 21 provided by the list processing unit 21.

In decoding processing, the number of lists is increased when the decoding processing corresponding to a data bit is performed, and the control unit 24 may control the control adapted to the number of lists in the middle of decoding.

Once the sequential decoding processing for $N_t$ bits is completed, the list processing unit 21 outputs, to the decoded bit selecting unit 25, the decoding candidates corresponding to the number of lists and the likelihood information of the decoding candidates such as path metric. Once the decoding candidates of the data length to be processed are calculated by the list processing unit 21, the decoded bit selecting unit 25 selects decoded bits using the decoding candidates. An example of the data length to be processed is $N_t$ bits. Specifically, for example, in a case where error detection processing has been performed on the K-bit bit sequence before encoding, the decoded bit selecting unit 25 performs error detection on each decoding candidate, selects and outputs decoding candidates with no error, and if errors are detected in all the decoding candidates, selects decoding candidates using the likelihood information of decoding candidates such as path metric. In a case where error detection has not been performed on the K-bit bit sequence before encoding, the decoded bit selecting unit 25 selects and outputs likely decoding candidates using the likelihood information of decoding candidates such as path metric.

The above-described error detection processing is exemplified by a process in which a CRC bit for error detection is added as a redundant bit, as in a generally known method of cyclic redundancy check (CRC) aided successive cancellation list decoding. In a case where error detection processing has been performed on the K-bit bit sequence before encoding, the decoded bit selecting unit 25 can perform error detection processing using the redundant bit. Note that error detection processing is not limited to CRC, and can be processes including forward error correction (FEC), parity code (parity check) such as vertical redundancy check (VRC) or longitudinal redundancy check (LRC), checksum, and the like. Besides these methods, any method that allows for error detection can be applied.

The frozen bit removing unit 26 removes frozen bits from the decoded bits output from the decoded bit selecting unit 25, and outputs the K-bit information bit sequence.

Here, the present embodiment uses successive cancellation list decoding as a decoding method. However, in the case of L=1, successive cancellation list decoding is equivalent to successive cancellation decoding (SCD), which is generally known as a method of decoding polar codes. Therefore, given L=1, the decoding circuit 2 illustrated in FIG. 8 can also perform decoding using successive cancellation decoding.

In addition, FIG. 8 illustrates an exemplary configuration based on successive cancellation list decoding in which the L circuits are executed in parallel corresponding to the maximum number of lists L so as to perform the processes corresponding to the respective lists. However, the only requirement is that the processing of executing the decoding processes corresponding to the number of lists is possible; therefore, a larger number of circuits than the maximum number of lists L may be implemented, and the control unit 24 may control each unit such that the processes corresponding to the necessary number of lists are executed. In addition, the number of lists may be variable, in which case the control unit 24 performs control so as to operate each unit necessary for processing according to the number of lists. In addition, it is also possible to execute the processes corresponding to the number of lists in time division using at least one parallel implementation circuit, the number of which is not greater than the number of lists. For example, although the likelihood calculating unit 30 in FIG. 8 includes the first likelihood computing units as n+1 parallel circuits from 200-0 to 200-*n*, the likelihood calculating unit 30 may include only one or more first likelihood computing units, and the one or more first likelihood computing units may perform n+1 likelihood computation processes in time division. Similarly, two or more likelihood computing units provided in the first likelihood computing unit may be processed in time division. Similarly, the polar encoding unit 22 and the bit arrangement changing unit 23 can each include one or more circuits to perform processing in time division.

As described above, the number of parallel implementation circuits of each type in the decoding circuit 2 according to the present embodiment is not limited to the example illustrated in FIG. 8, and can be freely set and implemented. As described above, the decoding circuit 2 according to the present embodiment implements a decoding circuit capable of decoding polar codes of the maximum code length N, and the control unit 24 controls necessary likelihood computation and list processing, so that the code length can be easily and dynamically controlled.

Next, hardware for implementing the decoding circuit 2 according to the present embodiment will be described. Each unit constituting the decoding circuit 2 can be implemented by processing circuitry that is dedicated hardware. Each unit constituting the decoding circuit 2 is implemented by, for example, the processing circuitry 130 illustrated in FIG. 6.

The processing circuitry 130 is similar to that in the first embodiment: the functions of the respective units constituting the decoding circuit 2 may be implemented by different pieces of processing circuitry 130, or all or some of the functions of the respective units may be collectively implemented by one or more pieces of processing circuitry.

The processing circuitry that implements each unit constituting the decoding circuit 2 may be a control circuit including a processor. This control circuit is, for example, a control circuit including the processor 140 and the memory 141 as illustrated in FIG. 7. In a case where the functions of the respective units constituting the decoding circuit 2 are implemented with the control circuit illustrated in FIG. 7, these functions can be implemented by software, firmware, or a combination of software and firmware. Software and firmware are described as programs and stored in the memory 141. The processor 140 reads and executes programs from the memory 141, thereby implementing the functions of the respective units of the decoding circuit 2. It can also be said that these programs cause a computer to execute the procedures and methods that are executed by the decoding circuit 2. The programs may be provided by a storage medium or a communication medium.

Note that some of the functions of the respective units of the decoding circuit 2 may be implemented by dedicated hardware, and the other functions may be implemented by software or firmware. That is, the functions of the respective units of the decoding circuit 2 may be implemented by a combination of processing circuitry which is dedicated hardware and a control circuit.

Figure 9:
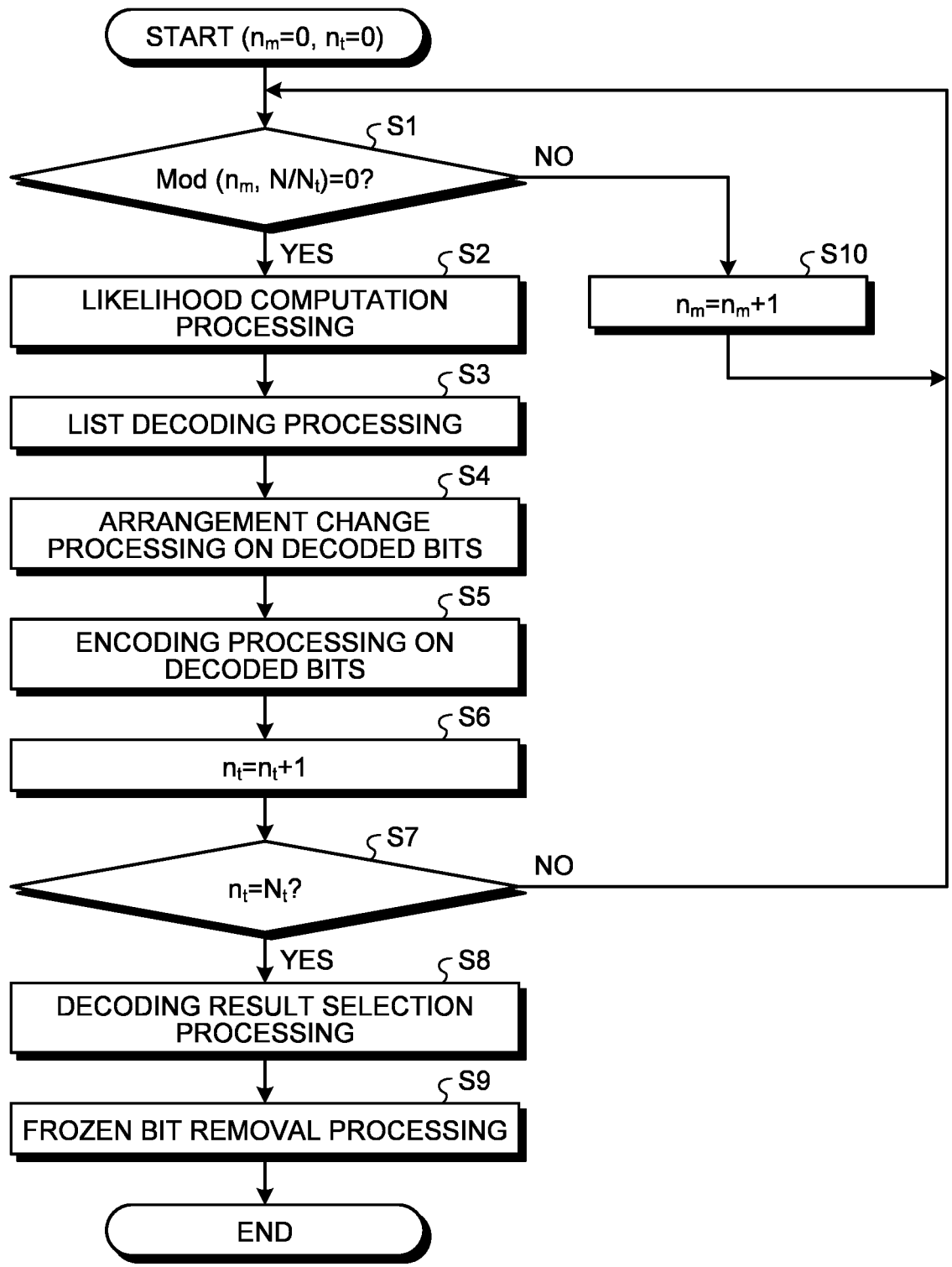
FIG. 9 is a flowchart illustrating an exemplary procedure for decoding processing according to the second embodiment.

Next, an exemplary procedure for processing in the decoding circuit 2 according to the present embodiment will be described. FIG. 9 is a flowchart illustrating an exemplary procedure for decoding processing according to the present embodiment. Here, an example in which the decoding circuit 2 performs successive cancellation list decoding will be described. When a signal to be decoded is input to the decoding circuit 2, the control unit 24 configures the initial settings for decoding processing by setting a bit number $n_m$ corresponding to the decoding processing of the maximum code length N and a bit number $n_t$ corresponding to the decoding processing of the code length $N_t$ to an initial value of zero, and performs decoding processing.

First, the control unit 24 determines whether the bit number $n_m$ is a bit position corresponding to the code word of the code length $N_t$, that is, whether a remainder Mod ($n_m$, $N/N_t$) obtained by dividing $n_m$ by $N/N_t$ is zero (step S1). In response to determining that Mod ($n_m$, $N/N_t$) is not zero (step S1: No), the bit number $n_m$ is incremented by one (step S10), and step S1 is performed again.

In response to determining that Mod ($n_m$, $N/N_t$) is zero (step S1: Yes), the control unit 24 causes likelihood computation processing to be executed (step S2). Specifically, the control unit 24 instructs, according to $N_t$, the likelihood computing units necessary for the processing to execute the processing, among the first likelihood computing units 200-0 to 200-n and the likelihood computing units in the first likelihood computing units 200-0 to 200-n. Consequently, the likelihood computation processing adapted to $N_t$ is performed.

Next, the list processing unit 21 executes list decoding processing to determine decoding candidates on the basis of the likelihood computation result (step S3). The bit arrangement changing units 23-0 to 23-n perform decoded bit rearrangement processing on the decoding candidates determined by the list processing unit 21 (step S4). Specifically, the bit arrangement changing units 23-0 to 23-n rearrange the bits so as to extend the decoding candidates determined by the list processing unit 21 to an N-bit bit sequence.

Next, the polar encoding units 22-0 to 22-n perform encoding processing on the decoded bits (step S5). The control unit 24 increments the bit number $n_t$ by one (step S6), and determines whether $n_t = N_t$ is satisfied, that is, whether the sequential decoding processing for $N_t$ bits has been completed (step S7). In response to determining that $n_t = N_t$ is not satisfied, (step S7: No), the control unit 24 returns to step S1.

In response to determining that $n_t = N_t$ is satisfied (step S7: Yes), the control unit 24 causes the list processing unit 21 to output the decoding candidates to the decoded bit selecting unit 25, and the decoded bit selecting unit 25 performs decoding result selection processing to determine the decoding result on the basis of the decoding candidates (step S8). Next, the frozen bit removing unit 26 performs frozen bit removal processing to remove frozen bits from the decoding result determined by the decoded bit selecting unit 25 (step S9). Through the above processing, the information bits input to the encoding circuit are restored.

As described above, the control unit 24 controls likelihood computation processing, so that the decoding circuit for the maximum code length N can be shared to decode polar codes of a plurality of code lengths. Therefore, it is possible to perform decoding that supports polar codes of a plurality of code lengths while preventing an increase in circuit scale. In addition, since the number of times of sequential decoding can also be limited to $N_t$ times, prevention of processing delay in a circuit designed and constructed according to the code length $N_t$ can be implemented. Note that as described above, when the number of lists L is one, successive cancellation list decoding is equivalent to successive cancellation decoding, and thus the flowchart illustrated in FIG. 9 also covers successive cancellation decoding.

Third Embodiment

Figure 10:
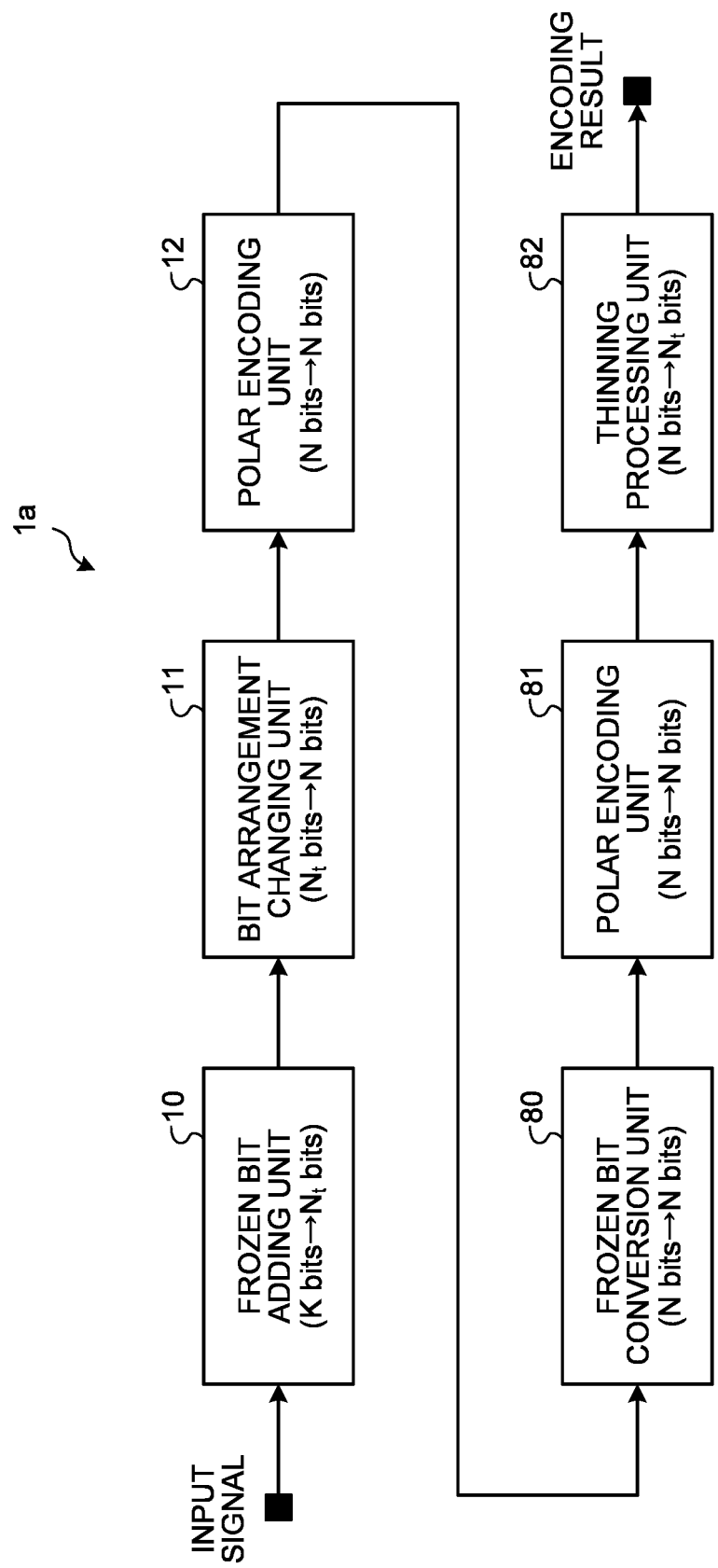
FIG. 10 is a block diagram illustrating an exemplary configuration of an encoding circuit according to a third embodiment.

FIG. 10 is a block diagram illustrating an exemplary configuration of an encoding circuit according to a third embodiment. Whereas the first embodiment has described the encoding circuit 1 that generates non-systematic polar codes, the present embodiment describes an encoding circuit 1a that generates systematic polar codes. Hereinafter, components having functions similar to those in the first embodiment are denoted by the same reference signs as those in the first embodiment, and redundant explanations are omitted. Hereinafter, differences from the first embodiment will be mainly described.

As illustrated in FIG. 10, the encoding circuit 1a includes the frozen bit adding unit 10, the bit arrangement changing unit 11, the polar encoding unit 12, a frozen bit conversion unit 80, a polar encoding unit 81, and a thinning processing unit 82. As in the first embodiment, the encoding circuit 1a can generate a polar code of a code length up to N bits. A polar code of a code length of $N_t$ bits specified or set from among the code lengths not greater than N bits can be generated.

The frozen bit adding unit 10, the bit arrangement changing unit 11, and the polar encoding unit 12 are similar to those in the first embodiment, and thus description thereof is omitted. The frozen bit conversion unit 80 replaces, with frozen bits, bits at positions in bit inversion order of the bit positions of the frozen bits set before encoding of a polar code, with respect to the bit sequence of an $N_t$-bit code word. Bit inversion order indicates the order of indexes in which the order of bits is reversed, for example by reversing the order of bit indexes in binary notation from the most significant bit (MSB) to the least significant bit (LSB). For example, in the case of four-bit bit sequence such as [$b_{4,0}$, $b_{4,1}$, $b_{4,2}$, $b_{4,3}$], i in $b_{4,i}$ indicates a bit index. The values 0, 1, 2, and 3 in decimal notation are respectively 00, 01, 10, and 11 in binary notation. In binary notation, in which the MSB is placed leftmost and the LSB is placed rightmost, reversely adjusting this bit order results in 00, 01, 10, and 11 becoming 00, 10, 01, and 11, respectively.

Referring to the example illustrated in FIG. 3, if $b_{8,0}$, $b_{8,1}$, $b_{8,2}$, and $b_{8,4}$ in b8 which is the input bit sequence 50 are frozen bits, the bit indexes thereof are 0, 1, 2, and 4, which are 000, 001, 010, and 100 in binary notation. Therefore, the positions in bit inversion order are the positions of the binary bit indexes 000, 100, 010, and 001, and the decimal bit indexes 0, 4, 2, and 1. Thus, the frozen bit conversion unit 80 replaces the positions of the bit indexes 0, 4, 2, and 1 with frozen bits in the code word 51 of c8. Given that frozen bits are zero, the frozen bit conversion unit 80 replaces c8=[$c_{8,0}$, $c_{8,1}$, ..., $c_{8,7}$] with [0, 0, 0, $c_{8,3}$, 0, $c_{8,6}$, $c_{8,7}$]. As the entire 16-bit encoded sequence of FIG. 3, [0, 0, 0, $c_{8,3}$, 0, $c_{8,5}$, $c_{8,6}$, $c_{8,7}$, 0, 0, 0, 0, 0, 0, 0, 0] is output because the remaining eight bits are zero values and are processed without replacement.

As described above, the frozen bit conversion unit 80 generates a third sequence from the result of encoding the second sequence by the polar encoding unit 12 by converting, into frozen bits, bits corresponding to the positions to which frozen bits have been added by the frozen bit adding unit 10. Specifically, the frozen bit conversion unit 80 replaces, with frozen bits, the positions in bit inversion order of the bit positions to which frozen bits have been added by the frozen bit adding unit 10, with respect to the bit sequence corresponding to the code word of the second code length in the result of encoding the second sequence by the polar encoding unit 12.

The polar encoding unit 81, which is a second polar encoding unit, performs polar encoding on the third sequence input from the frozen bit conversion unit 80, similarly to the polar encoding unit 12. The thinning processing unit 82 extracts and outputs, as a code word, $N_t$ bits corresponding to every $N/N_t$-th position set by the bit arrangement changing unit 11 from the bit sequence output from the polar encoding unit 81, similarly to the thinning processing unit 13.

As an example of the encoding processing according to the present embodiment, encoding processing in which N=16 and $N_t$=8 are given will be described. When a four-bit information sequence [$b_{4,0}$, $b_{4,1}$, $b_{4,2}$, $b_{4,3}$] is input as an input signal, the frozen bit adding unit 10 adds frozen bits to produce a bit sequence of $N_t$=8, and outputs the eight-bit bit sequence [$f_0$, $f_1$, $f_2$, $b_{4,0}$, $f_3$, $b_{4,1}$, $b_{4,2}$, $b_{4,3}$]. Note that the frozen bits are denoted by $f_0$, $f_1$, $f_2$, and $f_3$ in order to maintain generality. The bit arrangement changing unit 11 arranges the above eight-bit bit sequence every $N/N_t$ in a 16-bit bit sequence. Consequently, the bit arrangement changing unit 11 inputs the 16-bit bit sequence [$f_0$, 0, $f_1$, 0, $f_2$, 0, $b_{4,0}$, 0, $f_3$, 0, $b_{4,1}$, 0, $b_{4,2}$, 0, $b_{4,3}$, 0] to the polar encoding unit 12.

The polar encoding unit 12 performs the polar encoding of a bit length of 16 bits, thereby outputting the encoding result [$f_0\hat{\ }f_1\hat{\ }f_2\hat{\ }b_{4,0}\hat{\ }f_3\hat{\ }b_{4,1}\hat{\ }b_{4,2}\hat{\ }b_{4,3}$, $f_3\hat{\ }b_{4,1}\hat{\ }b_{4,2}\hat{\ }b_{4,3}$, $f_2\hat{\ }b_{4,0}\hat{\ }b_{4,2}\hat{\ }b_{4,3}$, $b_{4,2}\hat{\ }b_{4,3}$, $f_1\hat{\ }b_{4,0}\hat{\ }b_{4,1}\hat{\ }b_{4,3}$, $b_{4,1}\hat{\ }b_{4,3}$, $b_{4,0}\hat{\ }b_{4,3}$, $b_{4,3}$, 0, 0, 0, 0, 0, 0, 0, 0]. Here, "$\hat{\ }$" indicates an exclusive OR operation.

The frozen bit conversion unit 80 replaces, with frozen bits, the positions in bit inversion order of the positions where frozen bits have been arranged by the frozen bit adding unit 10, in the code word corresponding to $N_t$=8 (bit sequence having bit indexes corresponding to 0 to 7 in the 16-bit bit sequence output from the polar encoding unit 12). The 16-bit sequence that is the result of the replacement by the frozen bit conversion unit 80 is [$f_0$, $f_3$, $f_2$, $b_{4,2}\hat{\ }b_{4,3}$, $f_1$, $b_{4,1}\hat{\ }b_{4,3}$, $b_{4,0}\hat{\ }b_{4,3}$, $b_{4,3}$, 0, 0, 0, 0, 0, 0, 0, 0].

The polar encoding unit 81 performs polar encoding on the bit string that is the result of the replacement by the frozen bit conversion unit 80, and outputs the 16-bit bit sequence [$f_0\hat{\ }f_1\hat{\ }f_2\hat{\ }f_3\hat{\ }b_{4,0}\hat{\ }b_{4,1}\hat{\ }b_{4,2}$, 0, $f_1\hat{\ }b_{4,0}\hat{\ }b_{4,1}\hat{\ }b_{4,3}$, 0, $f_2\hat{\ }b_{4,0}\hat{\ }b_{4,2}\hat{\ }b_{4,3}$, 0, $b_{4,0}$, 0, $f_3\hat{\ }b_{4,1}\hat{\ }b_{4,2}\hat{\ }b_{4,3}$, 0, $b_{4,1}$, 0, $b_{4,2}$, 0, $b_{4,3}$, 0]. The thinning processing unit 82 extracts the bit sequence at the position where the eight-bit sequence has been arranged by the bit arrangement changing unit 11 from the bit sequence output from the polar encoding unit 81, and outputs [$f_0\hat{\ }f_1\hat{\ }f_2\hat{\ }f_3\hat{\ }b_{4,0}\hat{\ }b_{4,1}\hat{\ }b_{4,2}$, $f_1\hat{\ }b_{4,0}\hat{\ }b_{4,1}\hat{\ }b_{4,3}$, $f_2\hat{\ }b_{4,0}\hat{\ }b_{4,2}\hat{\ }b_{4,3}$, $b_{4,0}$, $f_3\hat{\ }b_{4,1}\hat{\ }b_{4,2}\hat{\ }b_{4,3}$, $b_{4,1}$, $b_{4,2}$, $b_{4,3}$].

Here, in the bit sequence output from the thinning processing unit 82, [$b_{4,0}$, $b_{4,1}$, $b_{4,2}$, $b_{4,3}$], which is the input sequence before the addition of frozen bits in the frozen bit adding unit 10, appears at the positions of the bit indexes 3, 5, 6, and 7. Therefore, the encoding circuit 1a can complete the systematic polar encoding processing through the above processing. In the encoding circuit 1a according to the present embodiment, the circuit for the maximum code length N is shared, and the bit arrangement changing unit 11 and the thinning processing unit 82 perform the arrangement change and the extraction of bits according to the code length $N_t$, so that the encoding processing of the code length $N_t$ is performed for $N_t$ that is a power of two and not greater than N. Thus, it is possible to easily and dynamically change the code length while preventing an increase in circuit scale.

In the present embodiment, the result encoded by the polar encoding unit 12 is input to the thinning processing unit 82 via the frozen bit conversion unit 80 and the polar encoding unit 81, and the data input to the thinning processing unit 82 is considered to be based on the result encoded by the polar encoding unit 12. This means that also in the present embodiment, the thinning processing unit 82 generates the code word of the second code length by thinning processing that is based on the result of encoding the second sequence by the polar encoding unit 12.

Each unit constituting the encoding circuit 1a according to the present embodiment can be implemented by processing circuitry that is dedicated hardware. As in the first embodiment, each unit constituting the encoding circuit 1a is implemented by, for example, the processing circuitry 130 illustrated in FIG. 6. The functions of the respective units constituting the encoding circuit 1a may be implemented by different pieces of processing circuitry 130, or all or some of the functions of the respective units may be collectively implemented by one or more pieces of processing circuitry.

The processing circuitry that implements each unit constituting the encoding circuit 1a may be a control circuit including a processor. As in the first embodiment, the control circuit includes the processor 140 and the memory 141 as illustrated in FIG. 7. In a case where the functions of the respective units constituting the encoding circuit 1a are implemented with the control circuit illustrated in FIG. 7, these functions can be implemented by software, firmware, or a combination of software and firmware. Software and firmware are described as programs and stored in the memory 141. The processor 140 reads and executes programs from the memory 141, thereby implementing the functions of the respective units of the encoding circuit 1a. It can also be said that these programs cause a computer to execute the procedures and methods that are executed by the encoding circuit 1a. The programs may be provided by a storage medium or a communication medium.

Note that some of the functions of the respective units of the encoding circuit 1a may be implemented by dedicated hardware, and the other functions may be implemented by software or firmware. For example, the functions of the polar encoding units 12 and 81 can be implemented by dedicated hardware, and the functions of the frozen bit adding unit 10, the bit arrangement changing unit 11, the frozen bit conversion unit 80, and the thinning processing unit 82 can be implemented by a control circuit. As described above, the functions of the respective units of the encoding circuit 1a may be implemented by a combination of processing circuitry which is dedicated hardware and a control circuit.

Fourth Embodiment

Figure 11:
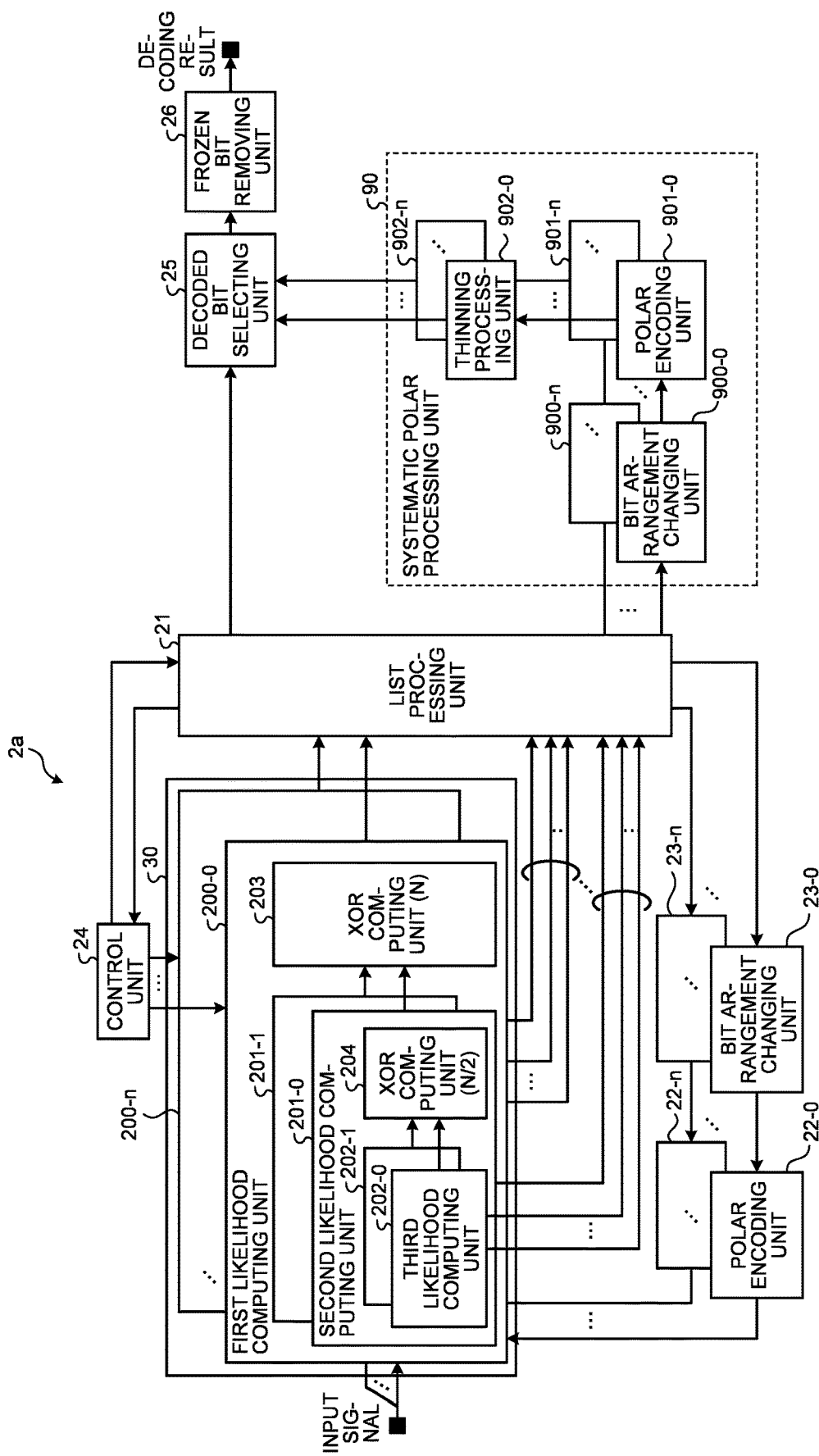
FIG. 11 is a block diagram illustrating an exemplary configuration of a decoding circuit according to a fourth embodiment.

FIG. 11 is a block diagram illustrating an exemplary configuration of a decoding circuit according to a fourth embodiment. A decoding circuit 2a illustrated in FIG. 11 executes successive cancellation list decoding processing that supports systematic polar codes.

As illustrated in FIG. 11, the decoding circuit 2a includes the first likelihood computing units 200-0 to 200-n, the likelihood calculating unit 30, the list processing unit 21, the polar encoding units 22-0 to 22-n, the bit arrangement changing units 23-0 to 23-n, the control unit 24, the decoded bit selecting unit 25, the frozen bit removing unit 26, and a systematic polar processing unit 90. The first likelihood computing units 200-0 to 200-n, the list processing unit 21, the polar encoding units 22-0 to 22-n, the bit arrangement changing units 23-0 to 23-n, the control unit 24, the decoded bit selecting unit 25, and the frozen bit removing unit 26 are similar to those in the second embodiment. Components having functions similar to those in the second embodiment are denoted by the same reference signs as those in the second embodiment, and redundant explanations are omitted. Hereinafter, differences from the second embodiment will be mainly described.

The difference between the decoding circuit 2a according to the present embodiment and the decoding circuit 2 according to the second embodiment illustrated in FIG. 8 is that the decoding circuit 2a includes the systematic polar processing unit 90 that performs decoding processing of systematic polar codes. The systematic polar processing unit 90 includes bit arrangement changing units 900-0 to 900-n, polar encoding units 901-0 to 901-n, and thinning processing units 902-0 to 902-n.

After list decoding processing is completed, the list processing unit 21 outputs the L decoding candidates to the corresponding bit arrangement changing units 900-0 to 900-n, and outputs, to the decoded bit selecting unit 25, likelihood information such as path metric indicating the likelihood of the L decoding candidates. The bit arrangement changing units 900-0 to 900-n arrange the decoding candidates output from the list processing unit 21 every $N/N_t$ bits to generate an N-bit bit sequence, similarly to the bit arrangement changing units 23-0 to 23-n. The polar encoding units 901-0 to 901-n perform polar encoding on the N-bit bit sequence generated by the corresponding bit arrangement changing units 900-0 to 900-n, similarly to the polar encoding units 22-0 to 22-n. The thinning processing units 902-0 to 902-n extract $N_t$ bits in ascending order of index from the encoded bit sequence, and output the extracted bit sequence to the decoded bit selecting unit 25, similarly to the thinning processing unit 13 of the encoding circuit 1 according to the first embodiment.

Here, the operation of the decoding circuit 2a according to the present embodiment will be described referring to an example in which N=16 and $N_t$=8 are given. The described example is based on the assumption that the eight-bit sequence $[f_0\hat{\,}f_1\hat{\,}f_2\hat{\,}f_3\hat{\,}b_{4,0}\hat{\,}b_{4,1}\hat{\,}b_{4,2},\ f_1\hat{\,}b_{4,0}\hat{\,}b_{4,1}\hat{\,}b_{4,3},\ f_2\hat{\,}b_{4,0}\hat{\,}b_{4,2}\hat{\,}b_{4,3},\ b_{4,0},\ f_3\hat{\,}b_{4,1}\hat{\,}b_{4,2}\hat{\,}b_{4,3},\ b_{4,1},\ b_{4,2},\ b_{4,3}]$ described in the third embodiment is transmitted, and the decoding circuit 2a receives this signal and performs decoding processing. In the decoding circuit 2a, successive cancellation list decoding is performed in a similar manner to that in the second embodiment, and upon successful decoding without errors, $[f_0, f_3, f_2, b_{4,2}\hat{\,}b_{4,3}, f_1, b_{4,1}\hat{\,}b_{4,3}, b_{4,0}\hat{\,}b_{4,3}, b_{4,3}]$ that is the eight-bit sequence obtained by performing polar encoding on the above eight-bit sequence is output from the list processing unit 21.

The bit arrangement changing units 900-0 to 900-n, which are a second bit arrangement changing unit, arrange the eight-bit sequence output from the list processing unit 21 every $N/N_t$ bits, thereby generating the 16-bit sequence $[f_0,$ 0, $f_3$, 0, $f_2$, 0, $b_{4,2}\hat{\,}b_{4,3}$, 0, $f_1$, 0, $b_{4,1}\hat{\,}b_{4,3}$, 0, $b_{4,0}\hat{\,}b_{4,3}$, 0, $b_{4,3}$, 0] and outputting the 16-bit sequence to the corresponding polar encoding units 901-0 to 901-n. The polar encoding units 901-0 to 901-n execute polar encoding on the 16-bit sequence output from the corresponding bit arrangement changing units 900-0 to 900-n, and output the encoding result $[f_0\hat{\,}f_1\hat{\,}f_2\hat{\,}f_3\hat{\,}b_{4,0}\hat{\,}b_{4,1}\hat{\,}b_{4,2},\ f_1\hat{\,}b_{4,0}\hat{\,}b_{4,1}\hat{\,}b_{4,3},\ f_2\hat{\,}b_{4,0}\hat{\,}b_{4,2}\hat{\,}b_{4,3},\ b_{4,0},\ f_3\hat{\,}b_{4,1}\hat{\,}b_{4,2}\hat{\,}b_{4,3},\ b_{4,1},\ b_{4,2},\ b_{4,3}, 0, 0, 0, 0, 0, 0, 0, 0]$ to the corresponding thinning processing units 902-0 to 902-n. That is, the bit arrangement changing units 900-0 to 900-n generate the second bit sequence of the first code length by arranging the decoding candidates output from the list processing unit 21 at the positions same as the positions where the bit arrangement changing units 23-0 to 23-n have arranged the decoding candidates, and the polar encoding units 901-0 to 901-n perform polar encoding on the second bit sequence.

The thinning processing units 902-0 to 902-n output, to the decoded bit selecting unit 25, the eight-bit bit sequence $[f_0\hat{\,}f_1\hat{\,}f_2\hat{\,}f_3\hat{\,}b_{4,0}\hat{\,}b_{4,1}\hat{\,}b_{4,2},\ f_1\hat{\,}b_{4,0}\hat{\,}b_{4,1}\hat{\,}b_{4,3},\ f_2\hat{\,}b_{4,0}\hat{\,}b_{4,2}\hat{\,}b_{4,3},\ b_{4,0},\ f_3\hat{\,}b_{4,1}\hat{\,}b_{4,2}\hat{\,}b_{4,3},\ b_{4,1},\ b_{4,2},\ b_{4,3}]$ having smaller bit indexes among the 16-bit bit sequence output from the polar encoding units 901-0 to 901-n. The decoded bit selecting unit 25 obtains $[b_{4,0}, b_{4,1}, b_{4,2}, b_{4,3}]$ by extracting the bits at the positions where information bits have been arranged in the encoding circuit 1a, that is, the bits of the bit indexes 3, 5, 6, and 7, from the bit sequence output from the thinning processing units 902-0 to 902-n. This matches the bit sequence of four-bit information bits before encoding in the encoding circuit 1a. This thus shows that the decoding circuit 2a according to the present embodiment is capable of performing decoding that supports systematic polar codes.

Note that the above example assumes that there is no error in the bit sequence output from the list processing unit 21, but in actual processing, it is unknown whether there is an error in the bit sequence output from the list processing unit 21, and thus the bit sequence output from the list processing unit 21 is output as the decoding candidates for the respective lists. Similarly to the decoded bit selecting unit 25 of the decoding circuit 2 according to the second embodiment, in a case where error detection has been performed on information bits, the decoded bit selecting unit 25 performs error detection on each decoding candidate, selects and outputs decoding candidates with no error, and if errors are detected from all the decoding candidates, selects decoding candidates using the likelihood information of decoding candidates such as path metric. Alternatively, in a case where error detection has not been performed on information bits, the decoded bit selecting unit 25 selects and outputs likely decoding candidates using the likelihood information of decoding candidates such as path metric. The frozen bit removing unit 26 removes frozen bits and outputs K-bit information bits, similarly to the frozen bit removing unit 26 of the decoding circuit 2 according to the second embodiment.

The present embodiment uses successive cancellation list decoding as a decoding method. However, as in the second embodiment, in the case of L=1, successive cancellation list decoding is equivalent to successive cancellation decoding, which is generally known as a method of decoding polar codes. Therefore, given L=1, the decoding circuit 2a illustrated in FIG. 11 can also perform decoding using successive cancellation decoding.

In addition, FIG. 11 illustrates an exemplary configuration based on successive cancellation list decoding in which the L circuits are executed in parallel corresponding to the maximum number of lists L so as to perform the processes corresponding to the respective lists. However, as described in the second embodiment, a larger number of circuits than the maximum number of lists L may be implemented, and the control unit 24 may control each unit such that the processes corresponding to the necessary number of lists are executed. In addition, the number of lists may be variable, in which case the control unit 24 performs control so as to operate each unit necessary for processing according to the number of lists. In addition, it is also possible to execute the processes corresponding to the number of lists in time division using at least one parallel implementation circuit, the number of which is not greater than the number of lists.

Each unit constituting the decoding circuit 2a according to the present embodiment can be implemented by processing circuitry that is dedicated hardware. As in the second embodiment, each unit constituting the decoding circuit 2a is implemented by, for example, the processing circuitry 130 illustrated in FIG. 6. The functions of the respective units constituting the decoding circuit 2a may be implemented by different pieces of processing circuitry 130, or all or some of the functions of the respective units may be collectively implemented by one or more pieces of processing circuitry.

The processing circuitry that implements each unit constituting the decoding circuit 2a may be a control circuit including a processor. As in the decoding circuit 2 according to the second embodiment, the control circuit includes the processor 140 and the memory 141 as illustrated in FIG. 7. In a case where the functions of the respective units constituting the decoding circuit 2a are implemented with the control circuit illustrated in FIG. 7, these functions can be implemented by software, firmware, or a combination of software and firmware. Software and firmware are described as programs and stored in the memory 141. The processor 140 reads and executes programs from the memory 141, thereby implementing the functions of the respective units of the decoding circuit 2a. It can also be said that these programs cause a computer to execute the procedures and methods that are executed by the decoding circuit 2a. The programs may be provided by a storage medium or a communication medium.

Note that some of the functions of the respective units of the decoding circuit 2a may be implemented by dedicated hardware, and the other functions may be implemented by software or firmware. As described above, the functions of the respective units of the decoding circuit 2a may be implemented by a combination of processing circuitry which is dedicated hardware and a control circuit.

Figure 12:
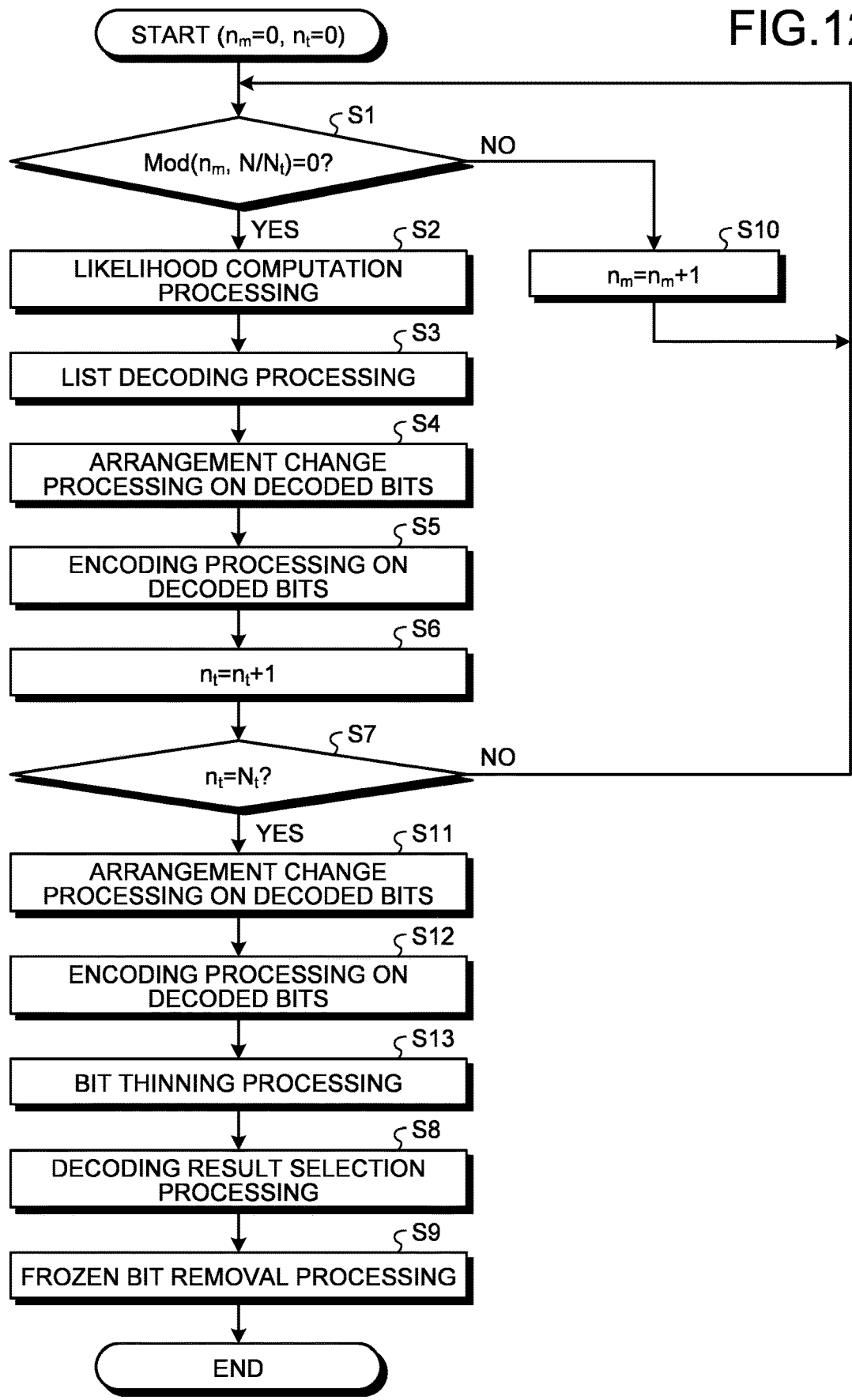
FIG. 12 is a flowchart illustrating an exemplary procedure for decoding processing according to the fourth embodiment.

Next, an exemplary procedure for processing in the decoding circuit 2a according to the present embodiment will be described. FIG. 12 is a flowchart illustrating an exemplary procedure for decoding processing according to the present embodiment. Here, an example in which the decoding circuit 2a performs successive cancellation list decoding will be described. Steps S1 to S7 and step S10 are similar to those in the second embodiment, and thus description thereof is omitted. Also in the present embodiment, the code length can be dynamically changed by the control unit 24 controlling the likelihood computation processing according to the $N_t$ bits.

In response to Yes in step S7, the bit arrangement changing units 900-0 to 900-n perform decoded bit arrangement change processing on the decoding candidates output from the list processing unit 21 (step S11). Specifically, the bit arrangement changing units 900-0 to 900-n arrange the decoding candidates output from the list processing unit 21 every $N/N_t$ bits to generate an N-bit bit sequence, and output the N-bit bit sequence to the corresponding polar encoding units 901-0 to 901-n.

The polar encoding units 901-0 to 901-n perform encoding processing on the decoded bits (step S12). Specifically, the polar encoding units 901-0 to 901-n perform encoding processing on the bit sequence output from the corresponding bit arrangement changing units 900-0 to 900-n, similarly to the polar encoding units 22-0 to 22-n, and output the encoding result to the corresponding thinning processing units 902-0 to 902-n.

The thinning processing units 902-0 to 902-n perform bit thinning processing on the encoding result output from the corresponding polar encoding units 901-0 to 901-n (step S13). Specifically, the thinning processing units 902-0 to 902-n extract $N_t$ bits having smaller bit indexes from the N-bit encoding result as the result of the systematic polar decoding processing, and output the $N_t$ bits to the decoded bit selecting unit 25. Subsequent steps S8 and S9 are similar to those in the second embodiment.

As described above, in the present embodiment, the control unit 24 controls likelihood computation processing, so that the decoding circuit for the maximum code length N can be shared to decode systematic polar codes of a plurality of code lengths. Therefore, it is possible to decode systematic polar codes of a plurality of code lengths while preventing an increase in circuit scale.

Fifth Embodiment

Figure 13:
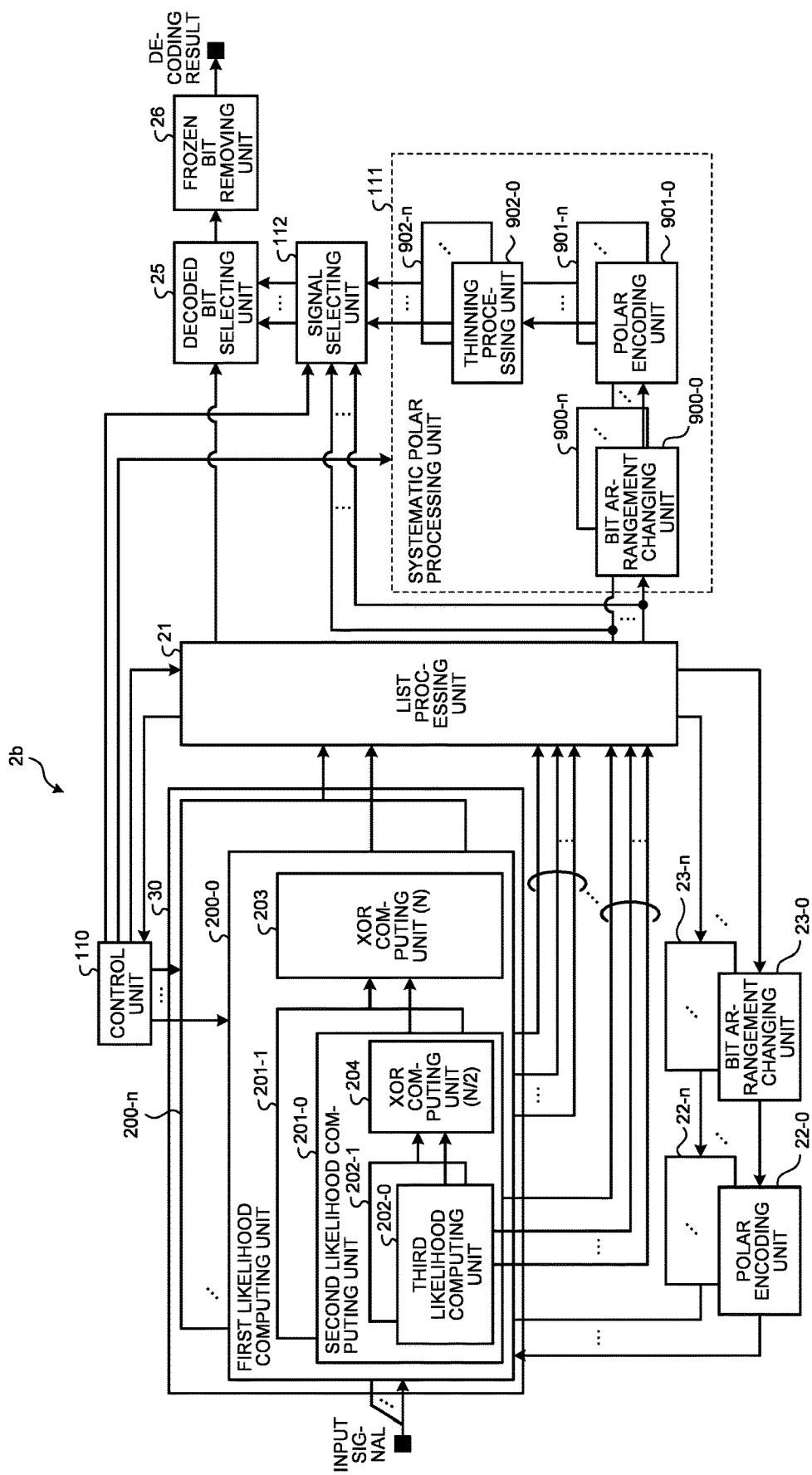
FIG. 13 is a block diagram illustrating an exemplary configuration of a decoding circuit according to a fifth embodiment.

FIG. 13 is a block diagram illustrating an exemplary configuration of a decoding circuit according to the fifth embodiment. A decoding circuit 2b illustrated in FIG. 13 can execute decoding processing that supports both polar codes and systematic polar codes using successive cancellation list decoding.

As illustrated in FIG. 13, the decoding circuit 2b is similar to the decoding circuit 2a according to the fourth embodiment except that a signal selecting unit 112 is added to the decoding circuit 2a according to the fourth embodiment, and a control unit 110 and a systematic polar processing unit 111 are provided instead of the control unit 24 and the systematic polar processing unit 90.

The first likelihood computing units 200-0 to 200-n, the list processing unit 21, the polar encoding units 22-0 to 22-n, the bit arrangement changing units 23-0 to 23-n, the decoded bit selecting unit 25, and the frozen bit removing unit 26 are similar to those in the second and fourth embodiments. Components having functions similar to those in the fourth embodiment are denoted by the same reference signs as those in the fourth embodiment, and redundant explanations are omitted. Hereinafter, differences from the fourth embodiment will be mainly described.

The control unit 110 according to the present embodiment controls successive cancellation list decoding processing by each likelihood computing unit, the list processing unit 21, the polar encoding units 22-0 to 22-n, and the bit arrangement changing units 23-0 to 23-n, similarly to the control unit 24 according to the second and fourth embodiments. The operation of the decoding circuit 2b up to the completion of successive list decoding processing is similar to the operation of the decoding circuit 2 according to the second embodiment and the operation of the decoding circuit 2a according to the fourth embodiment.

In the present embodiment, the control unit 110 further controls which one of the decoding processing of a polar code, i.e. a processing result from the list processing unit 21, or the decoding processing of a systematic polar code, i.e. a processing result from the systematic polar processing unit 111 is to be selected. The signal selecting unit 112 selects the decoding candidates output from the list processing unit 21 or the decoding candidates output from the systematic polar processing unit 111 on the basis of an instruction from the control unit 110, and outputs the selected decoding candidates to the decoded bit selecting unit 25.

In the case of the decoding processing of a polar code, the control unit 110 performs control to stop the systematic polar processing unit 111, and to cause the signal selecting unit 112 to select the decoding candidates from the list processing unit 21 and output the decoding candidates to the decoded bit selecting unit 25. In the case of the decoding processing of a systematic polar code, the control unit 110 performs control to operate the systematic polar processing unit 111, and to cause the signal selecting unit 112 to select the decoding candidates from the systematic polar processing unit 111 and output the selected decoding candidates to the decoded bit selecting unit 25.

When instructed to stop by the control unit 110, the systematic polar processing unit 111 stops each circuit inside the systematic polar processing unit 111, and when instructed to operate by the control unit 110, operates each circuit inside the systematic polar processing unit 111. The systematic polar processing unit 111 is similar to the systematic polar processing unit 90 according to the fourth embodiment except that the function of switching between stop and operation on the basis of an instruction from the control unit 110 is added.

As described above, by adding the signal selection control by the control unit 110 and the signal selecting unit 112 to the decoding circuit 2a according to the fourth embodiment, it is possible to configure the decoding circuit 2b capable of performing decoding processing by selecting a polar code or a systematic polar code. Note that the present embodiment describes an example in which successive cancellation list decoding is used as a decoding method. However, as in the second and fourth embodiments, in the case of L=1, successive cancellation list decoding is equivalent to successive cancellation decoding, and thus the decoding circuit 2b according to the present embodiment can also support successive cancellation decoding.

In addition, FIG. 13 illustrates an exemplary configuration based on successive cancellation list decoding in which the L circuits are executed in parallel corresponding to the maximum number of lists L so as to perform the processes corresponding to the respective lists. However, as described in the second embodiment, a larger number of circuits than the maximum number of lists L may be implemented, and the control unit 110 may control each unit such that the processes corresponding to the necessary number of lists are executed. In addition, the number of lists may be variable, in which case the control unit 110 performs control so as to operate each unit necessary for processing according to the number of lists. In addition, it is also possible to execute the processes corresponding to the number of lists in time division using at least one parallel implementation circuit, the number of which is not greater than the number of lists.

Each unit constituting the decoding circuit 2b according to the present embodiment can be implemented by processing circuitry that is dedicated hardware. As in the second embodiment, each unit constituting the decoding circuit 2b is implemented by, for example, the processing circuitry 130 illustrated in FIG. 6. The functions of the respective units constituting the decoding circuit 2b may be implemented by different pieces of processing circuitry 130, or all or some of the functions of the respective units may be collectively implemented by one or more pieces of processing circuitry.

The processing circuitry that implements each unit constituting the decoding circuit 2b may be a control circuit including a processor. As in the decoding circuit 2 according to the second embodiment, the control circuit includes the processor 140 and the memory 141 as illustrated in FIG. 7. In a case where the functions of the respective units constituting the decoding circuit 2b are implemented with the control circuit illustrated in FIG. 7, these functions can be implemented by software, firmware, or a combination of software and firmware. Software and firmware are described as programs and stored in the memory 141. The processor 140 reads and executes programs from the memory 141, thereby implementing the functions of the respective units of the decoding circuit 2b. It can also be said that these programs cause a computer to execute the procedures and methods that are executed by the decoding circuit 2b. The programs may be provided by a storage medium or a communication medium.

Note that some of the functions of the respective units of the decoding circuit 2b may be implemented by dedicated hardware, and the other functions may be implemented by software or firmware. As described above, the functions of the respective units of the decoding circuit 2b may be implemented by a combination of processing circuitry which is dedicated hardware and a control circuit.

Figure 14:
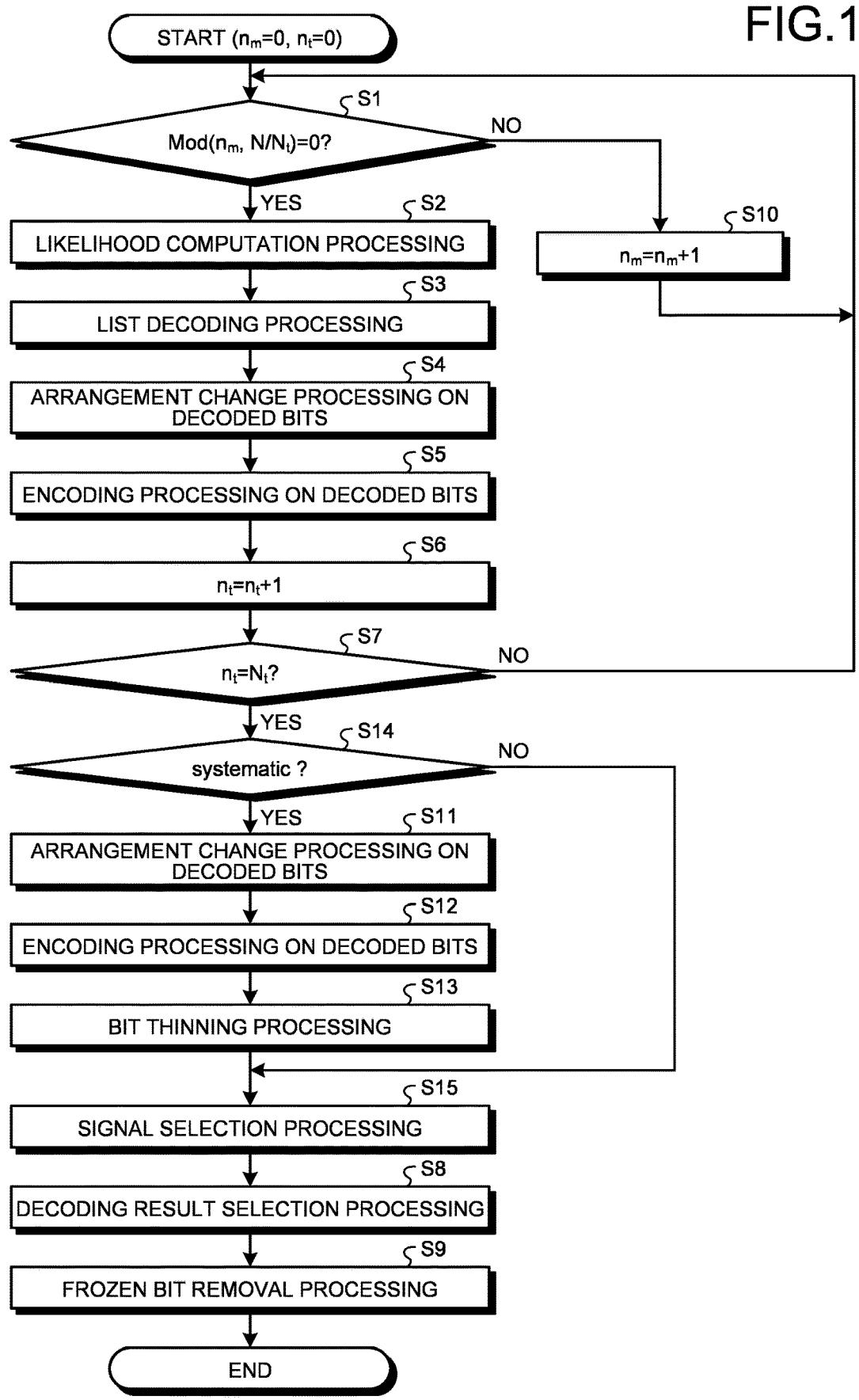
FIG. 14 is a flowchart illustrating an exemplary procedure for decoding processing according to a fifth embodiment.

Next, an exemplary procedure for processing in the decoding circuit 2b according to the present embodiment will be described. FIG. 14 is a flowchart illustrating an exemplary procedure for decoding processing according to the present embodiment. Here, an example in which the decoding circuit 2b performs successive cancellation list decoding will be described. Steps S1 to S7 and step S10 are similar to those in the second embodiment, and thus description thereof is omitted. Also in the present embodiment, the code length can be dynamically changed by the control unit 110 controlling the likelihood computation processing according to the $N_t$ bits.

In response to Yes in step S7, the control unit 110 determines whether to perform the decoding processing of a systematic polar code (step S14). In the case of the decoding processing of a systematic polar code (step S14: Yes), the control unit 110 activates the systematic polar processing unit 111 so that steps S11 to S13 are performed. Steps S11 to S13 are similar to those in the fourth embodiment.

The control unit 110 performs signal selection processing (step S15), and causes steps S8 and S9 to be performed. Steps S8 and S9 are similar to those in the second and fourth embodiments. In the signal selection processing, the control unit 110 performs control to cause the signal selecting unit 112 to select the decoding candidates from the list processing unit 21 and output the decoding candidates to the decoded bit selecting unit 25 in the case of the decoding processing of a polar code, and performs control to cause the signal selecting unit 112 to select the decoding candidates from the systematic polar processing unit 111 and output the decoding candidates to the decoded bit selecting unit 25 in the case of the decoding processing of a systematic polar code.

In the case of the decoding processing of a polar code (step S14: No), the control unit 110 advances the processing to step S15. Through the above processing, the decoding circuit 2b according to the present embodiment can switch between the decoding processing of a polar code and the decoding processing of a systematic polar code.

As described above, in the present embodiment, the control unit 110 controls likelihood computation processing, so that the decoding circuit for the maximum code length N can be shared to decode systematic polar codes of a plurality of code lengths. Therefore, it is possible to decode polar codes of a plurality of code lengths and to decode systematic polar codes of a plurality of code amounts while preventing an increase in circuit scale.

Sixth Embodiment

Figure 15:
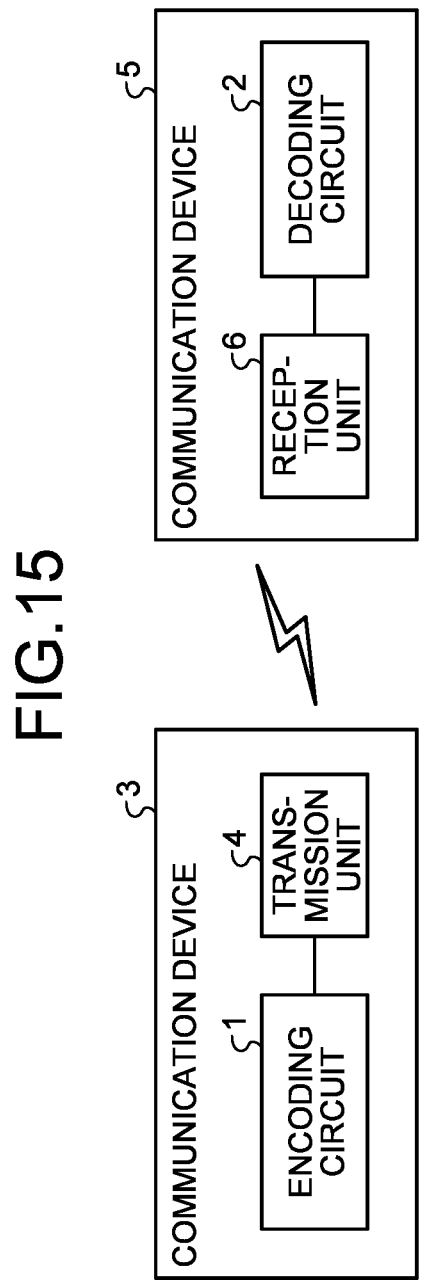
FIG. 15 is a diagram illustrating an exemplary configuration of a communication system according to a sixth embodiment.

FIG. 15 is a diagram illustrating an exemplary configuration of a communication system according to the sixth embodiment. As illustrated in FIG. 15, the communication system according to the present embodiment includes a communication device 3 that is a transmission device and a communication device 5 that is a reception device. The communication device 3 includes the encoding circuit 1 described in the first embodiment and a transmission unit 4 that transmits a result encoded by the encoding circuit 1 as a wireless signal. The communication device 5 includes a reception unit 6 that receives a signal transmitted from the communication device 3, and the decoding circuit 2 that is described in the second embodiment and decodes the signal received by the reception unit 6.

As described in the first and second embodiments, the communication device 3 and the communication device 5 according to the present embodiment can dynamically change the code length of polar codes. Therefore, the code length can be changed according to the data length of data exchanged between the communication device 3 and the communication device 5. Therefore, the communication device 3 and the communication device 5 can skip rate conversion processing with high complexity such as puncturing and shortening, so that it is possible to prevent the load and processing delay of transmission/reception processing. Thus, by using the encoding circuit 1 according to the first embodiment and the decoding circuit 2 according to the second embodiment, decoding delay can be shortened as compared with the case where rate conversion processing such as puncturing and shortening is performed using an encoding circuit and a decoding circuit for polar codes of the maximum code length. In addition, as described in the first and second embodiments, a plurality of code lengths can be supported by one piece of processing circuitry, and thus an increase in circuit scale can be prevented.

In a case where the encoding circuit 1 of the communication device 3 is implemented by the control circuit according to the first embodiment, for example, the communication device 3 includes a polar encoding circuit that is the polar encoding unit 12 capable of encoding a polar code of the first code length. Then, the control circuit causes the communication device 3 to execute: generating the first sequence by adding frozen bits to an input signal; generating the second sequence of the first code length by arranging the first sequence in the second sequence according to an arrangement rule that depends on the ratio of the second code length and the first code length, the second code length being the code length of a polar code to be encoded and being less than or equal to the first code length; inputting the second sequence to the polar encoding circuit; and generating a code word of the second code length by thinning processing that is based on a result of encoding the second sequence by the polar encoding circuit. In addition, in a case where these processes are implemented by software, a program for controlling the communication device causes the communication device 3 to execute these processes.

In the example illustrated in FIG. 15, the communication device 3 is a transmission device and the communication device 5 is a reception device. However, both the communication device 3 and the communication device 5 may have the functions of a transmission device and a reception device. The example illustrated in FIG. 15 depicts the wireless communication system as a communication system, but the present disclosure is not limited thereto, and the communication device 3 and the communication device 5 may perform wired communication.

Although FIG. 15 illustrates an example in which the communication device 3 includes the encoding circuit 1 according to the first embodiment and the communication device 5 includes the decoding circuit 2 according to the second embodiment, the communication device 3 may include the encoding circuit 1a according to the third embodiment instead of the encoding circuit 1, and the communication device 5 may include the decoding circuit 2a instead of the decoding circuit 2. The communication device 3 may include the encoding circuit 1 and the encoding circuit 1a to switch between polar codes and systematic polar codes for transmission, and the communication device 5 may include the decoding circuit 2b instead of the decoding circuit 2.

In the example described in the present embodiment, the encoding circuit 1 or 1a according to the first or third embodiment and the decoding circuit 2, 2a, or 2b according to the second, fourth, or fifth embodiment are applied to the communication system, but the application thereof is not limited to the communication system. The encoding circuit 1 or 1a according to the first or third embodiment and the decoding circuit 2, 2a, or 2b according to the second, fourth, or fifth embodiment may be applied to error correction in a storage means such as a hard disk drive (HDD) or a flash memory, or may be applied to other techniques.

The present disclosure can achieve the effect of supporting polar codes of a plurality of code lengths while preventing an increase in circuit scale.

The configurations described in the above-mentioned embodiments indicate examples. The embodiments can be combined with another well-known technique and with each other, and some of the configurations can be omitted or changed in a range not departing from the gist.

What is claimed is:
1. An encoding circuit comprising:
first polar encoding circuitry capable of encoding a polar code of a first code length;
frozen bit adding circuitry to generate a first sequence by adding frozen bits to an input signal; and
bit arrangement changing circuitry to: generate a second sequence of the first code length by arranging the first sequence in the second sequence according to an arrangement rule that depends on a ratio of a second code length and the first code length, the second code length being a code length of a polar code to be encoded and being less than or equal to the first code length, and setting bit values at bit positions other than positions where the first sequence is arranged in the second sequence to zero when the second code length is less than the first code length; and input the second sequence to the first polar encoding circuitry, wherein
a code word of the second code length is generated by thinning processing that is based on a result of encoding the second sequence by the first polar encoding circuitry.

2. The encoding circuit according to claim 1, wherein the frozen bit adding circuitry adds the frozen bits such that a data length of the first sequence becomes the second code length.

3. The encoding circuit according to claim 1, wherein the bit arrangement changing circuitry inputs the first sequence as the second sequence to the first polar encoding circuitry when the second code length is equal to the first code length.

4. The encoding circuit according to claim 1, wherein when the second code length is less than the first code length, the bit arrangement changing circuitry arranges bit values of the first sequence at every n-th bit position in the second sequence, where n is a quotient obtained by dividing the first code length by the second code length.

5. The encoding circuit according to claim 4 comprising thinning processing circuitry to select, as the code word, bits of the second code length at consecutive bit positions from the result of encoding the second sequence by the first polar encoding circuitry.

6. The encoding circuit according to claim 1, wherein
the polar code is a systematic polar code, and
the encoding circuit includes:
frozen bit conversion circuitry to generate a third sequence from the result of encoding the second sequence by the first polar encoding circuitry by converting, into the frozen bits, bits corresponding to positions to which the frozen bits are added by the frozen bit adding circuitry;
second polar encoding circuitry to perform polar encoding on the third sequence; and
thinning processing circuitry to select the code word of the second code length from a result of encoding by the second polar encoding circuitry.

7. The encoding circuit according to claim 6, wherein the frozen bit conversion circuitry replaces, with the frozen bits, positions in bit inversion order of bit positions to which the frozen bits are added by the frozen bit adding circuitry, with respect to a bit sequence corresponding to the code word of the second code length in the result of encoding the second sequence by the first polar encoding circuitry.

8. The encoding circuit according to claim 6 comprising thinning processing circuitry to select, as the code word, values at every n-th bit position from the result of encoding by the second polar encoding circuitry, where n is a quotient obtained by dividing the first code length by the second code length.

9. A decoding circuit comprising:
likelihood calculating circuitry capable of calculating likelihood information of a polar code of a first code length, the likelihood calculating circuitry being configured to calculate likelihood information corresponding to a polar code of a second code length less than or equal to the first code length on the basis of an input signal and a decoding interim result;
decoding processing circuitry to select decoding candidates on a bit-by-bit basis by sequential decoding using the likelihood information calculated by the likelihood calculating circuitry;
first bit arrangement changing circuitry to generate a first bit sequence of the first code length by arranging the decoding candidates selected by the decoding processing circuitry in the first bit sequence according to an arrangement rule that depends on a ratio of the second code length and the first code length;
first polar encoding circuitry to perform polar encoding on the first bit sequence, and input the first bit sequence polar-encoded to the likelihood calculating circuitry as the decoding interim result;
control circuitry to control the likelihood calculating circuitry and the decoding processing circuitry on the basis of the second code length such that sequential decoding is performed according to the second code length;
decoded bit selecting circuitry to, in response to the decoding candidates of a data length to be processed being calculated by the decoding processing circuitry, select decoded bits as a decoding result using the decoding candidates; and
frozen bit removing circuitry to remove a frozen bit from the decoding result.

10. The decoding circuit according to claim 9, wherein given that the first code length is N and $\log_2 N$ is m,
the likelihood calculating circuitry includes, hierarchically from i=1 to i=m−1, i-th likelihood computing circuits each including:
two (i+1)-th likelihood computing circuits; and
exclusive OR operation circuitry to calculate an exclusive OR of the exclusive ORs of likelihood calculated by the two (i+1)-th likelihood computing circuits.

11. The decoding circuit according to claim 10, wherein according to the second code length, the control circuitry stops the i-th likelihood computing circuits and the exclusive OR operation circuitry not to be used for computing the likelihood information of the second code length among the i-th likelihood computing circuits from i=1 to i=m−1.

12. The decoding circuit according to claim 9, wherein the data length to be processed is the second code length.

13. The decoding circuit according to claim 9, wherein when the second code length is less than the first code length, the first bit arrangement changing circuitry generates the first bit sequence by: arranging interim decoding candidates selected by the decoding processing circuitry at every n-th bit position, where n is a quotient obtained by dividing the first code length by the second code length; and setting bit values at bit positions where decoding processing are not performed to zero.

14. The decoding circuit according to claim 9, wherein the first polar encoding circuitry is capable of performing polar encoding of the first code length.

15. The decoding circuit according to claim 9, wherein the control circuitry controls a bit position to be referred to by the likelihood calculating circuitry in a result of encoding by the first polar encoding circuitry according to information representing a progress status of processing in the decoding processing circuitry provided by the decoding processing circuitry.

16. The decoding circuit according to claim 9, wherein the control circuitry notifies the decoding processing circuitry whether a target for processing in the decoding processing circuitry is the frozen bit according to information representing a progress status of processing in the decoding processing circuitry provided by the decoding processing circuitry.

17. The decoding circuit according to claim 9, wherein
the sequential decoding is successive cancellation list decoding,
the likelihood calculating circuitry calculates the likelihood information corresponding to the number of lists,
the decoding processing circuitry selects the decoding candidates corresponding to the number of lists, and inputs information indicating likelihood of the decoding candidates corresponding to the number of lists to the decoded bit selecting circuitry, and the decoded bit selecting circuitry selects the decoded bits using the information indicating likelihood.

18. The decoding circuit according to claim 9, wherein the sequential decoding is successive cancellation list decoding,
the input signal is assigned a redundant bit for error detection before polar encoding, and
the decoded bit selecting circuitry selects the decoded bits from the decoding candidates of the second code length corresponding to the number of lists using the redundant bit.

19. The decoding circuit according to claim 9, wherein the polar code is a systematic polar code,
the decoding circuit includes
systematic polar processing circuitry to perform decoding processing of a systematic polar code, and
the systematic polar processing circuitry includes:
second bit arrangement changing circuitry to generate a second bit sequence of the first code length by arranging the decoding candidates corresponding to the second code length selected by the decoding processing circuitry at positions same as positions where the first bit arrangement changing circuitry arranges the decoding candidates;
second polar encoding circuitry to perform polar encoding on the second bit sequence; and
thinning processing circuitry to select a code word of the second code length from a result of encoding by the second polar encoding circuitry.

20. The decoding circuit according to claim 9, wherein the polar code is a systematic polar code or a non-systematic polar code,
the decoding circuit includes:
systematic polar processing circuitry to perform decoding processing of a systematic polar code; and
signal selecting circuitry to select a processing result from the systematic polar processing circuitry or a processing result from the decoding processing circuitry, and output the processing result selected to the decoded bit selecting circuitry,
the systematic polar processing circuitry includes:
second bit arrangement changing circuitry to generate a second bit sequence of the first code length by arranging the decoding candidates corresponding to the second code length selected by the decoding processing circuitry at positions same as positions where the first bit arrangement changing circuitry arranges the decoding candidates;
second polar encoding circuitry to perform polar encoding on the second bit sequence; and
thinning processing circuitry to select a code word of the second code length from a result of encoding by the second polar encoding circuitry, and
the control circuitry instructs the signal selecting circuitry to select the processing result from the systematic polar processing circuitry when a systematic polar code is decoded, and instructs the signal selecting circuitry to select the processing result from the decoding processing circuitry when a non-systematic polar code is decoded.

21. A decoding method comprising:
a likelihood computing in which likelihood information of a polar code of a first code length is calculable, and likelihood information corresponding to a polar code of a second code length less than or equal to the first code length is calculated on the basis of an input signal and a decoding interim result;
a decoding candidate selecting of selecting decoding candidates sequentially on a bit-by-bit basis using the likelihood information calculated in the likelihood computing;
a first bit arrangement changing of generating a first bit sequence of the first code length by arranging the decoding candidates selected in the decoding candidate selecting in the first bit sequence according to an arrangement rule that depends on a ratio of the second code length and the first code length;
a first polar encoding of performing polar encoding on the first bit sequence, and inputting the first bit sequence polar-encoded to the likelihood computing as the decoding interim result;
a control of controlling the likelihood computing and the decoding candidate selecting on the basis of the second code length such that sequential decoding is performed according to the second code length;
a decoded bit selecting of, in response to the decoding candidates of a data length to be computed being calculated in the decoding candidate selecting, selecting decoded bits as a decoding result using the decoding candidates; and
a frozen bit removing of removing a frozen bit from the decoding result.

22. The decoding method according to claim 21, wherein the polar code is a systematic polar code, and
the decoding method includes:
a second bit arrangement changing of generating a second bit sequence of the first code length by arranging the decoding candidates corresponding to the second code length selected in the decoding candidate selecting at positions same as positions where the decoding candidates are arranged in the first bit arrangement changing;
a second polar encoding of performing polar encoding on the second bit sequence; and
a thinning processing of selecting a code word of the second code length from a result of encoding in the second polar encoding.

23. The decoding method according to claim 21, wherein the polar code is a systematic polar code or a non-systematic polar code,
the decoding method includes:
a systematic polar processing of performing decoding processing of a systematic polar code when a systematic polar code is decoded; and
a selecting of inputting a processing result in the systematic polar processing to the decoded bit selecting when a systematic polar code is decoded, and inputting the decoding candidates selected in the decoding candidate selecting to the decoded bit selecting when a non-systematic polar code is decoded, and
the systematic polar processing includes:
a second bit arrangement changing of generating a second bit sequence of the first code length by arranging the decoding candidates corresponding to the second code length selected in the decoding candidate selecting at positions same as positions where the decoding candidates are arranged in the first bit arrangement changing;
a second polar encoding of performing polar encoding on the second bit sequence; and
a thinning processing of selecting a code word of the second code length from a result of encoding in the second polar encoding.

* * * * *